(12) United States Patent
Kobayashi et al.

(10) Patent No.: US 10,090,657 B2
(45) Date of Patent: *Oct. 2, 2018

(54) CIRCUIT ASSEMBLY, CONNECTED BUSBAR STRUCTURE, AND ELECTRICAL JUNCTION BOX

(71) Applicants: AutoNetworks Technologies, Ltd., Yokkaichi-shi, Mie (JP); Sumitomo Wiring Systems, Ltd., Yokkaichi-shi, Mie (JP); Sumitomo Electric Industries, Ltd., Chuo-ku, Osaka-shi, Osaka (JP)

(72) Inventors: Takehito Kobayashi, Yokkaichi (JP); Yoshikazu Sasaki, Yokkaichi (JP); Shigeki Yamane, Yokkaichi (JP); Yukinori Kita, Yokkaichi (JP); Tomohiro Ooi, Yokkaichi (JP)

(73) Assignees: AutoNetworks Technolgies, Ltd., Yokkaichi, Mie (JP); Sumitomo Wiring Systems, Ltd., Yokkaichi, Mie (JP); Sumitomo Electric Industries, Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/309,978

(22) PCT Filed: Apr. 21, 2015

(86) PCT No.: PCT/JP2015/062074
§ 371 (c)(1),
(2) Date: Nov. 9, 2016

(87) PCT Pub. No.: WO2015/170578
PCT Pub. Date: Nov. 12, 2015

(65) Prior Publication Data
US 2017/0149222 A1 May 25, 2017

(30) Foreign Application Priority Data

May 9, 2014 (JP) .................................. 2014-097426
May 9, 2014 (JP) .................................. 2014-097716
May 9, 2014 (JP) .................................. 2014-097719

(51) Int. Cl.
H02G 3/16 (2006.01)
H05K 1/02 (2006.01)
(Continued)

(52) U.S. Cl.
CPC ............... *H02G 3/16* (2013.01); *H02G 3/081* (2013.01); *H05K 1/0203* (2013.01);
(Continued)

(58) Field of Classification Search
USPC ......................................... 361/624, 622, 637
See application file for complete search history.

(56) References Cited

U.S. PATENT DOCUMENTS 6,320,748 B1 * 11/2001 Roden ................... H01L 23/367
165/185
2003/0137813 A1 * 7/2003 Onizuka .............. H05K 1/0263
361/777
(Continued)

FOREIGN PATENT DOCUMENTS

DE         10360441 A1    7/2004
DE    102008039921 A1    3/2010
(Continued)

OTHER PUBLICATIONS

International Search Report dated Jul. 21, 2015 pertaining to International Application No. PCT/JP2015/062074.
(Continued)

*Primary Examiner* — Andargie M Aychillhum
(74) *Attorney, Agent, or Firm* — Honigman Miller Schwartz & Cohn LLP

(57) ABSTRACT

Provided is a circuit assembly that includes a circuit board that has an opening, a plurality of busbars that are laid on one surface side of the circuit board, a coil that has a main
(Continued)

portion 16 and a plurality of lead terminals, the lead terminals being connected to the plurality of busbars that are exposed through the opening, and a heatsink that is laid, via an adhesive agent, on surfaces of the plurality of busbars that are opposite to the circuit board. Cut-out portions for evacuating the adhesive agent are formed at edges of the plurality of busbars that are opposite to each other in the opening.

13 Claims, 24 Drawing Sheets

(51) Int. Cl.
| | | |
|---|---|---|
| | *H05K 3/00* | (2006.01) |
| | *H02G 3/08* | (2006.01) |
| | *H05K 1/11* | (2006.01) |
| | *H05K 7/14* | (2006.01) |
| | *H05K 7/02* | (2006.01) |
| | *H05K 1/18* | (2006.01) |

(52) U.S. Cl.
CPC ........... *H05K 1/0263* (2013.01); *H05K 1/115* (2013.01); *H05K 1/181* (2013.01); *H05K 3/0061* (2013.01); *H05K 7/026* (2013.01); *H05K 7/1427* (2013.01); *H05K 1/182* (2013.01); *H05K 2201/1003* (2013.01); *H05K 2201/10022* (2013.01); *H05K 2201/10166* (2013.01); *H05K 2201/10272* (2013.01)

(56) References Cited

U.S. PATENT DOCUMENTS

| | | | |
|---|---|---|---|
| 2004/0190272 | A1 | 9/2004 | Takagi et al. |
| 2013/0241047 | A1* | 9/2013 | Omae ............... H01L 23/49524 257/712 |

FOREIGN PATENT DOCUMENTS

| | | | |
|---|---|---|---|
| JP | 52140870 A | | 11/1977 |
| JP | 2003008164 A | | 1/2003 |
| JP | 2003164039 A | | 6/2003 |
| JP | 2013-099071 | * | 5/2013 |
| JP | 2013099071 A | | 5/2013 |

OTHER PUBLICATIONS

English translation of office action issued in co-pending application No. DE 11 2015 000 733.4, dated Oct. 6, 2017.

* cited by examiner

CIRCUIT ASSEMBLY, CONNECTED BUSBAR STRUCTURE, AND ELECTRICAL JUNCTION BOX

CROSS-REFERENCE TO RELATED APPLICATIONS

This application is the U.S. national phase of PCT/JP2015/062074 filed Apr. 21, 2015, which claims priority to Japanese Patent Application JP 2014-097716 filed May 9, 2014; JP 2014-097719 filed May 9, 2014; and JP 2014-097426 filed May 9, 2014.

FIELD OF THE INVENTION

The technique disclosed in the present description relates to a circuit assembly, a connected busbar structure, and an electrical junction box.

BACKGROUND OF THE INVENTION

Conventionally, devices in which a circuit assembly including a circuit board on which various electronic components are mounted is accommodated in a case are known as devices for energizing and de-energizing in-car electric components.

In such devices, the electronic components mounted on the circuit board are small and have superior functionality.

However, these electronic components have a relatively large heat generation, and thus if heat generated by the electronic components stay in the case, there will be a risk that the temperature in the case increases and the performance of the electronic components accommodated in the case decreases.

Accordingly, as an example of various structures for discharging the heat generated by the circuit board or the electronic components, a circuit assembly 111 as shown in FIG. 7 is conceivable that has a configuration in which a heat discharging member 130 is provided on that surface of a circuit board 112 that is opposite to the surface on which an electronic component 115 is provided.

On the other hand, as shown in FIGS. 6 and 7, it is also conceivable that an opening 113 is formed in a region of the circuit board 112 that corresponds to the electronic component 115, a plurality of busbars 120 are provided on that surface of the circuit board 112 that is opposite to the surface on which the electronic component 115 is provided, and terminals 117 of the electronic component 115 are connected to the busbars 120 exposed through the opening 113. By configuring an electric power circuit with the plurality of busbars 120, it is possible to flow a high current through the electric power circuit.

However, when the electronic component 115 is connected to the plurality of busbars 120 via the opening 113 formed in the circuit board 112, an adhesive agent 135 for bonding the heat discharging member that is laid (layered) on the surfaces of the busbars 120 that are opposite to the circuit board 112 may enter a gap S between adjacent busbars 120, and may get into contact with a lower surface of a main portion 116 of the electronic component 115, as shown in FIG. 7. In such a situation, if the adhesive agent 135 expands due to the heat generated by the circuit board 112 or the electronic component 115, or adversely contracts by being cooled, the electronic component 115 will be pushed or drawn by the adhesive agent 135, possibly causing a connection failure such as a crack in a connection section between the terminal 117 and the busbar 120.

The technique disclosed in the present description was made in view of the above-described circumstances, and it is an object thereof to provide a circuit assembly and an electrical junction box that have high connection reliability.

SUMMARY

According to the technique disclosed in the present description, a circuit assembly includes: a circuit board that has an opening; a plurality of busbars that are laid on one surface side of the circuit board; an electronic component that has a main portion and a plurality of lead terminals, the lead terminals being connected to the plurality of busbars that are exposed through the opening; and a heatsink that is laid, via an adhesive agent, on surfaces of the plurality of busbars that are opposite to the circuit board, and is characterized in that cut-out portions for evacuating the adhesive agent are formed at parts of edges of the plurality of busbars that are opposite to each other in a region of the opening.

According to the technique disclosed in the present description, the adhesive agent that has entered a gap between adjacent busbars in the region of the opening extends broadly and shallowly in the cut-out portions of the busbars, thus preventing the adhesive agent from getting into direct contact with the lower surface of the main portion of the electronic component. Accordingly, even if the adhesive agent expands due to the heat generated in the electronic component or the circuit board, or adversely contracts by being cooled, the electronic component will be prevented from being directly affected thereby, preventing connection sections between the lead terminals and the busbars from being affected. Accordingly, it is possible to achieve a circuit assembly and an electrical junction box that have high connection reliability.

A configuration is also possible in which a pair of the cut-out portions are formed at positions of the plurality of busbars that are opposite to each other in the region of the opening.

With the configuration in which the pair of cut-out portions are formed at positions of the plurality of busbars that are opposite to each other in the region of the opening, it is possible to ensure a large area for the gap between the busbars, making it possible to prevent the adhesive agent from getting into contact with the lower surface of the main portion of the electronic component.

Furthermore, the technique disclosed in the present description relates to an electrical junction box in which the circuit assembly is accommodated in a case.

According to the technique disclosed in the present description, it is possible to achieve a circuit assembly or an electrical junction box that have improved connection reliability.

DETAILED DESCRIPTION

Figure 1:
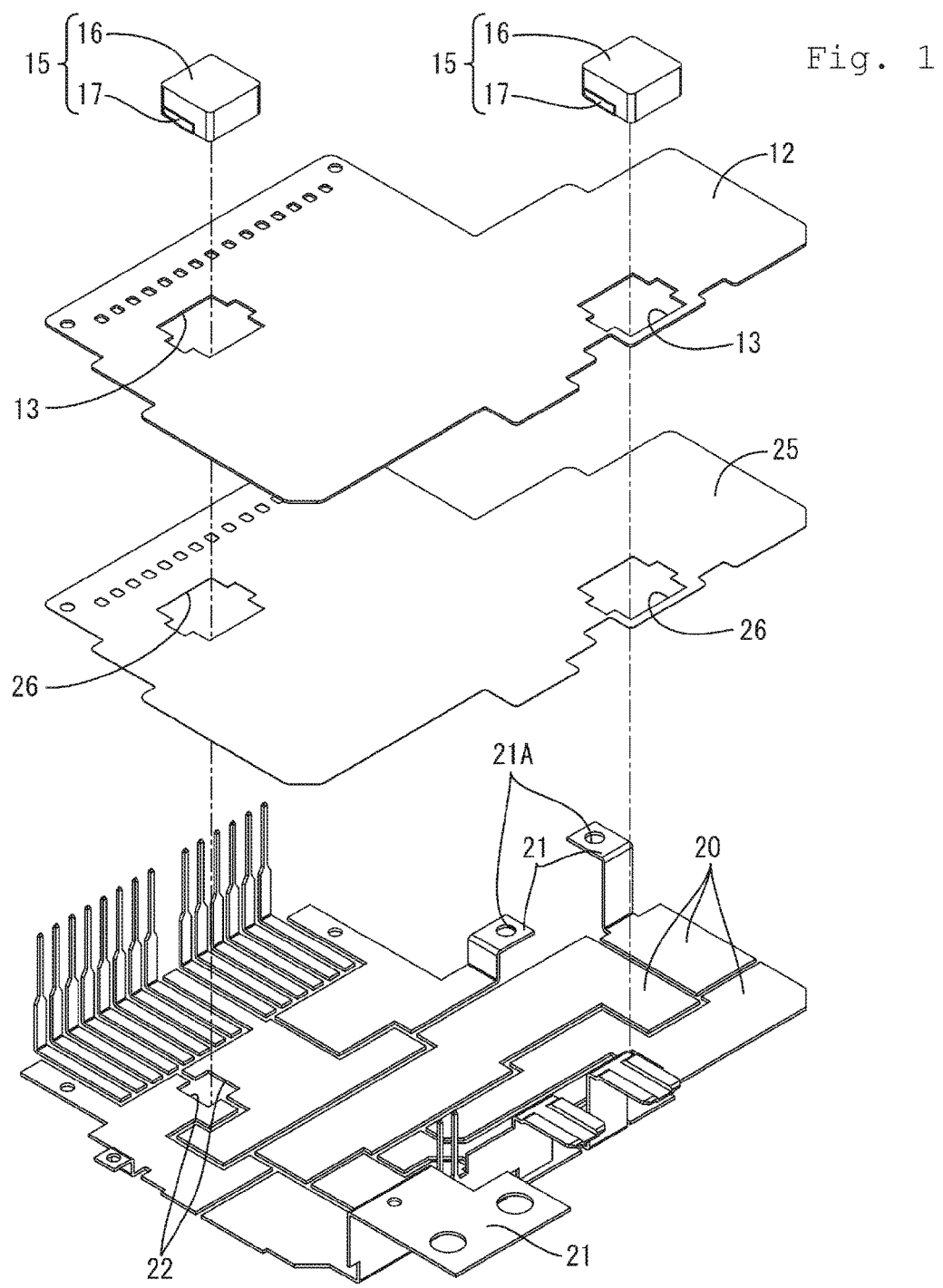
FIG. 1 is an exploded perspective view illustrating a part of a circuit assembly of according to one embodiment described herein.
Figure 2:
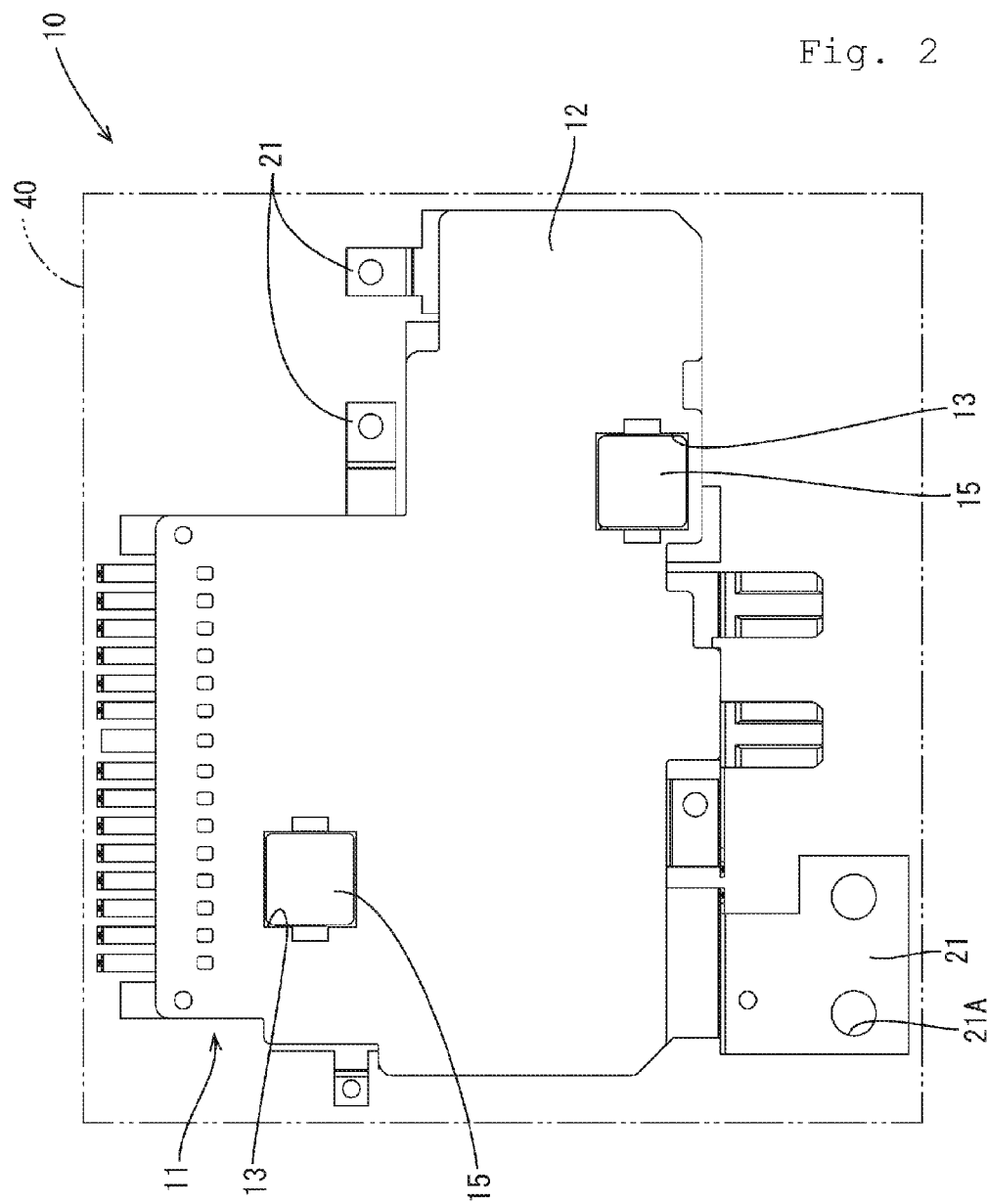
FIG. 2 is a plan view illustrating the inside of an electrical junction box.

An embodiment of a circuit assembly will be described with reference to FIGS. 1 to 5.

An electrical junction box 10 of the present embodiment is provided with a circuit assembly 11 including a circuit board 12 and a heatsink 30, and a synthetic resin case 40 that accommodates the circuit assembly 11. Note that in the following description, the upper side of FIG. 1 refers to "front side" or "upper side", and the lower side of FIG. 1 refers to "rear side" or "lower side".

As shown in FIG. 1, the circuit assembly 11 is provided with the circuit board 12, coils 15 (an example of an electronic component) that are arranged on the front surface (upper side of FIG. 1) of the circuit board 12, a plurality of busbars 20 that are arranged on the rear surface (lower side of FIG. 1) of the circuit board 12, and the heatsink 30 (see FIG. 5) that is arranged on the rear surfaces of the busbars 20.

The circuit board 12 is substantially L-shaped, and has, on its front surface, a conductive circuit that is not shown and is achieved by printed wiring.

Figure 5:
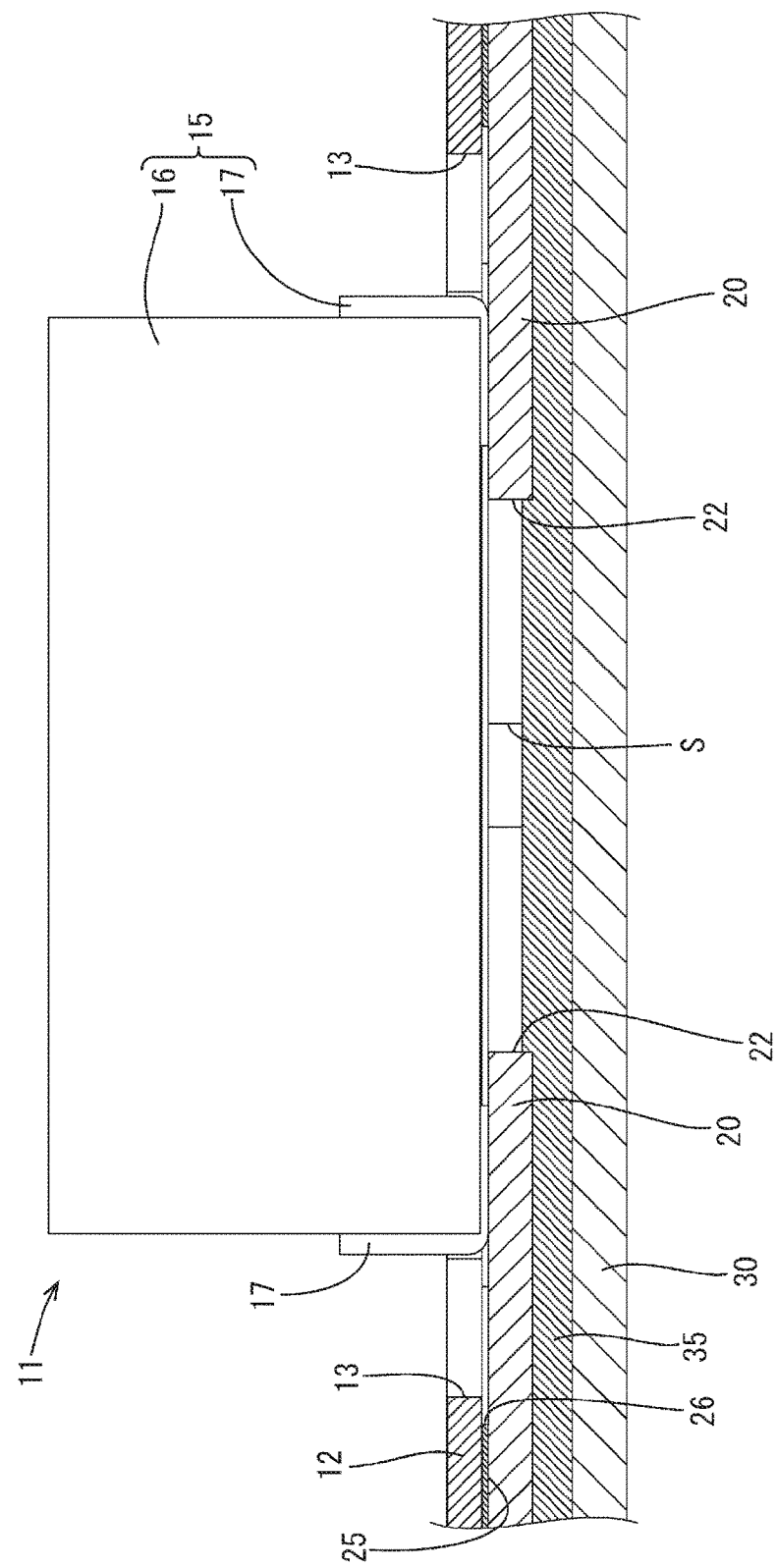
FIG. 5 is a partial cross-sectional view taken along the line A-A of FIG. 4.
Figure 6:
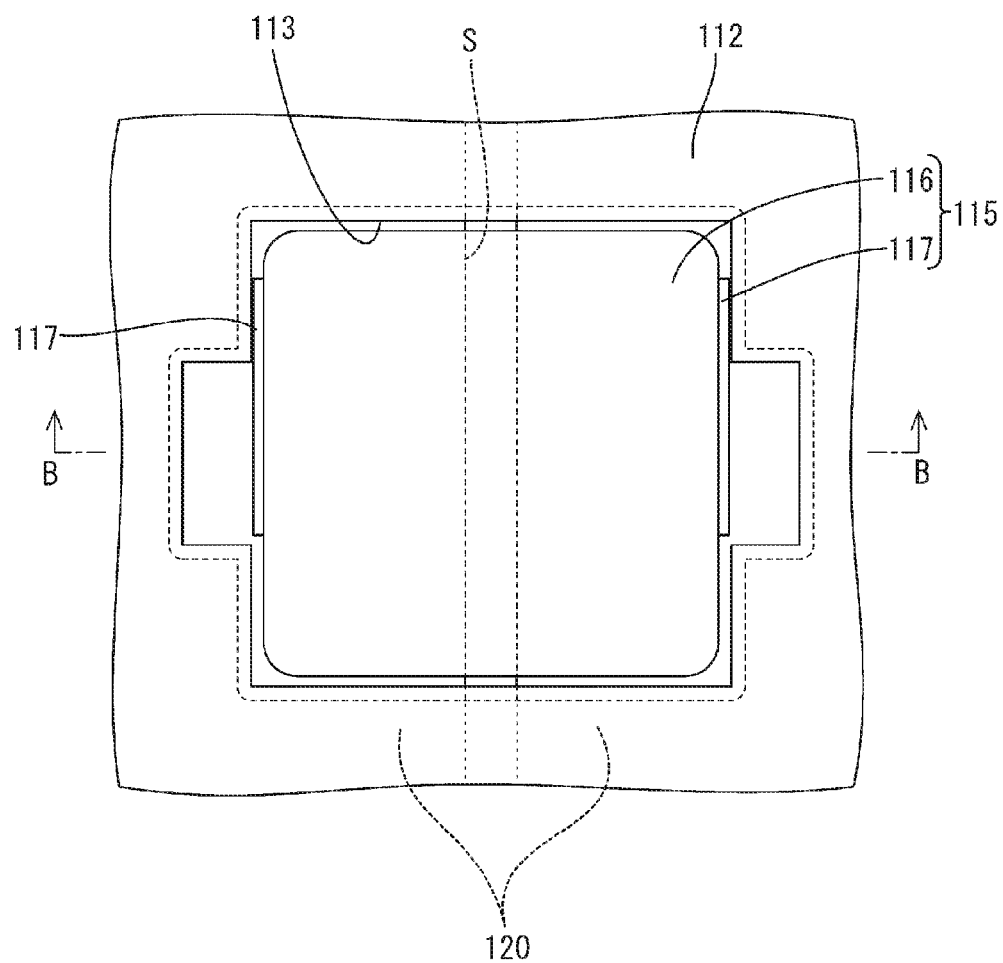
FIG. 6 is a partially enlarged plan view illustrating the state in which the coil is connected to the busbars, according to a hypothetical technique.
Figure 7:
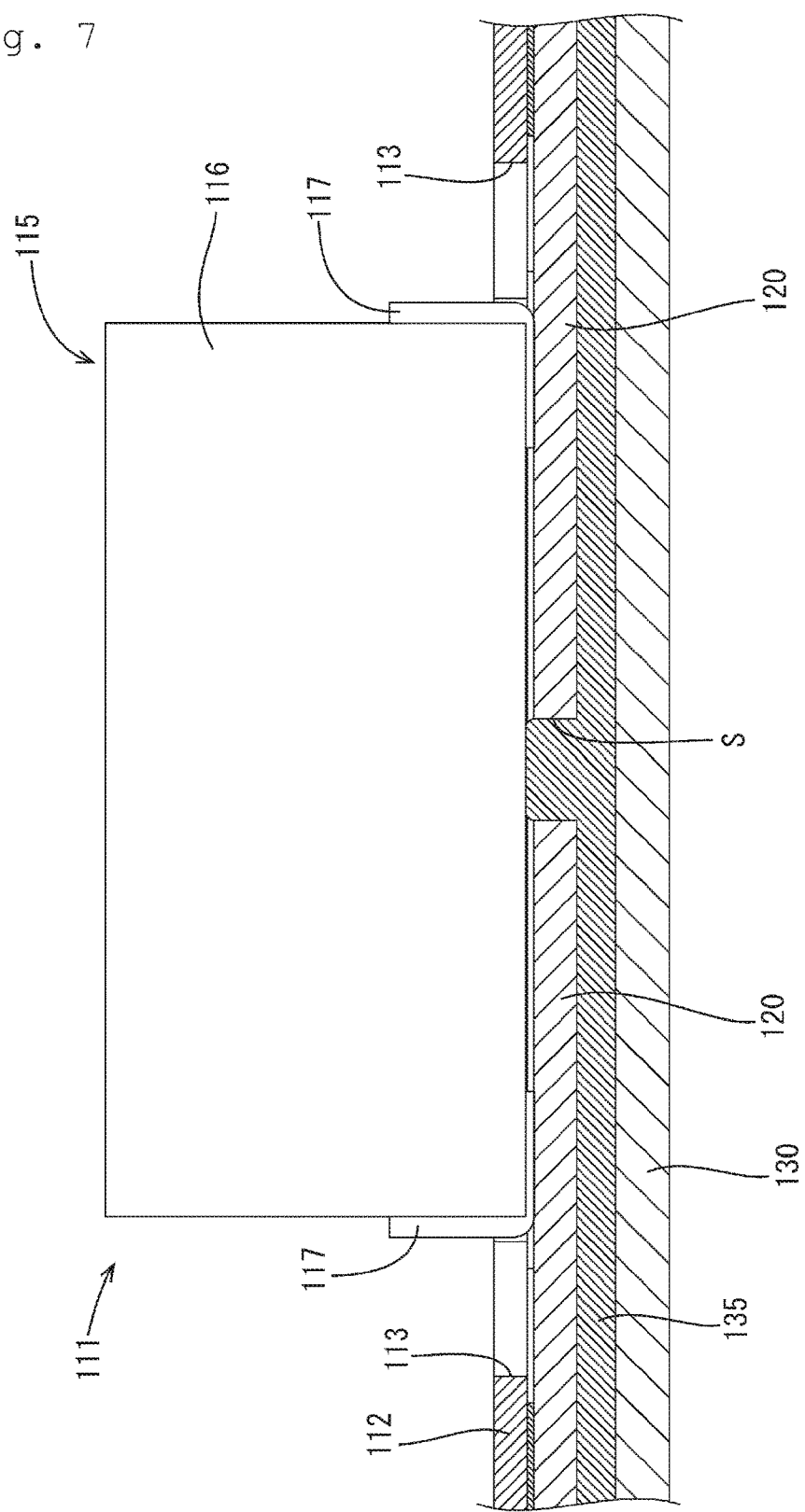
FIG. 7 is a partial cross-sectional view taken along the line B-B of FIG. 6.

As shown in FIGS. 1 and 5, each coil 15 is a surface-mounted coil, and has a main portion 16 in the shape of a rectangular parallelepiped, and a pair of lead terminals 17 provided in the vicinity of the edges of two opposing sides of the bottom surface of the main portion 16.

The plurality of busbars 20 are formed by pressing a metal plate into predetermined shapes. The busbars 20 are substantially rectangular, and are arranged in a predetermined pattern with a gap S between adjacent busbars 20. Some busbars 20 have, on an edge thereof, a connecting piece 21 that protrudes outward and is formed as one piece with the corresponding busbar 20. Each connecting piece 21 has a bolt mounting hole 21A through which a bolt is inserted, and is electrically connected to an external power supply, the bolt (not shown) being inserted through the bolt mounting hole 21A and being screwed to a power supply terminal mounted on a vehicle.

The plurality of busbars 20 are adhered to the rear surface of the circuit board 12 via an insulating adhesive sheet 25. The adhesive sheet 25 has substantially the same shape as the circuit board 12.

Figure 4:
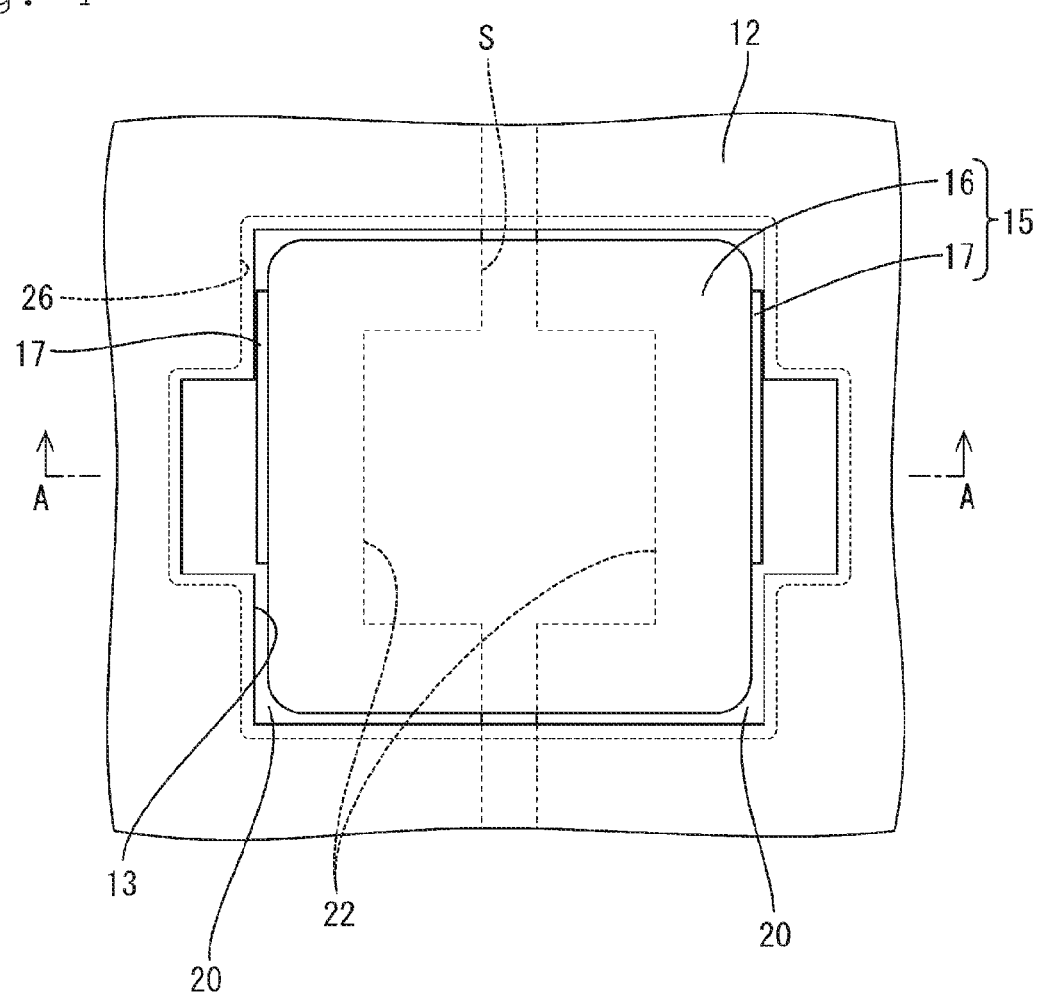
FIG. 4 is a partially enlarged plan view illustrating the state in which a coil is connected to the busbars.

As shown in FIG. 1, the circuit board 12 has openings 13 for mounting the coils 15 on the busbars 20 at positions at which the coils 15 are arranged. As shown in FIG. 4, a part of each opening 13 through which the main portion 16 of the coil 15 is arranged opens in the shape of a rectangle that is slightly larger than the bottom surface of the main portion 16. Furthermore, openings with a small width are formed extending from a pair of edges on which the lead terminals 17 of the coil 15 are located.

Figure 3:
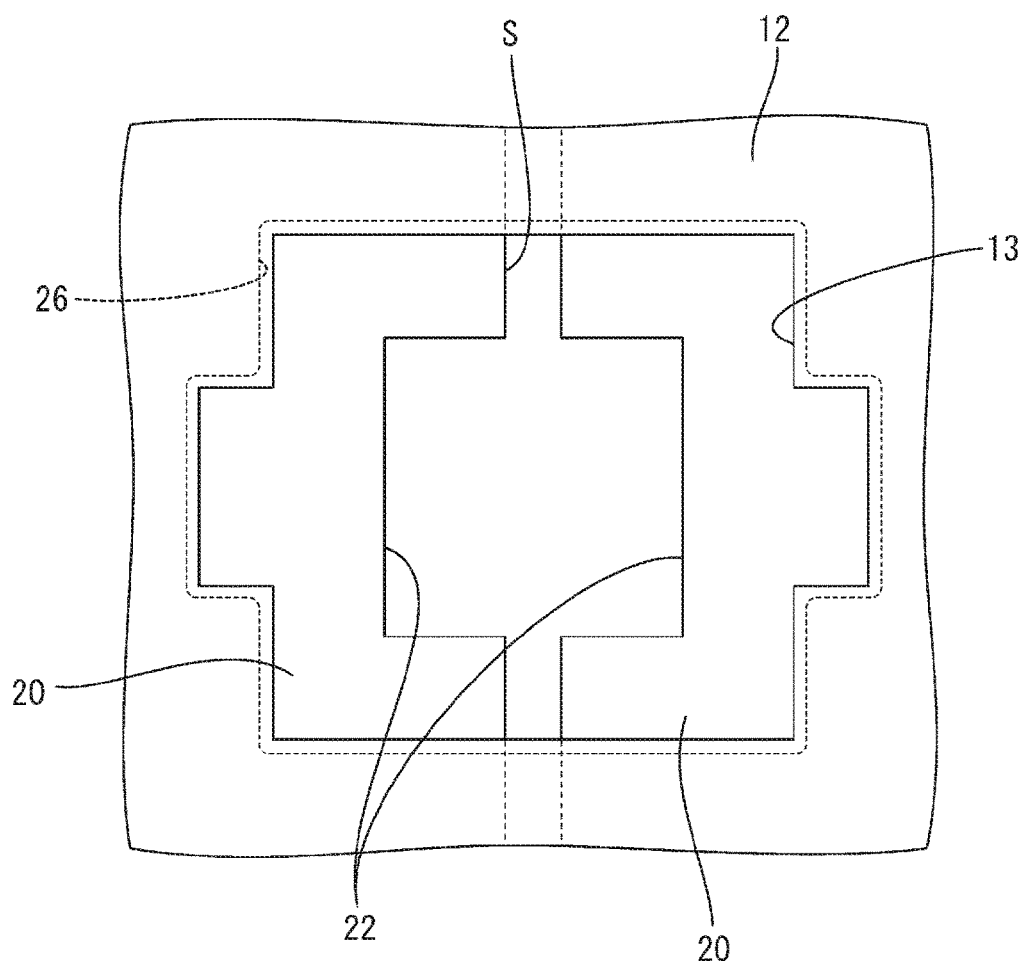
FIG. 3 is a partially enlarged plan view illustrating the state in which busbars are partially exposed through a connection opening.

Furthermore, the adhesive sheet 25 has, at the positions corresponding to the openings 13 of the circuit board 12, sheet openings 26 that have substantially the same shape as the openings 13 and have an opening size slightly larger than that of the openings 13 (see FIGS. 1 and 3).

In the region of each opening 13 of the circuit board 12, a pair of the busbars 20 is partially exposed. The exposed pair of busbars 20 have, at parts of their opposite edges, cut-out portions 22 that are cut out in the shape of a rectangle so as to extend the gap S between the adjacent busbars 20. In the present embodiment, the cut-out portions 22 are respectively provided in the pair of busbars 20, opposing each other.

The coils 15 are arranged on the front surface side of the circuit board 12, namely, in the regions in which the connection openings 13 are formed. In the present embodiment, the lead terminals 17 of the coils 15 are connected to the surfaces of the busbars 20 that are exposed through the opening 13 and the sheet opening 26 by a well-known method such as soldering.

The heatsink 30 is arranged on the lower surfaces (rear surfaces) of the busbars 20 (see FIG. 5). The heatsink 30 is a plate-shaped member that is made of a metal material such as aluminum or an aluminum alloy that is excellent in heat conductivity, and has the function to discharge heat generated in the circuit board 12 and the coils 15. The heatsink 30 is adhered to the rear surface side of the busbars 20 with, for example, a thermosetting adhesive agent 35. The adhesive agent 35 is an adhesive agent that is insulating and has heat conductivity.

The following will describe an example of a method for manufacturing the electrical junction box 10 according to the present embodiment. First, as shown in FIG. 1, the adhesive sheet 25, cut in a predetermined shape, is laid on the lower surface of the circuit board 12 on whose front surface an electrically conducting path is formed by printed wiring, and the plurality of busbars 20 arranged in a predetermined pattern are pressed thereto. Accordingly, the circuit board 12 and the plurality of busbars 20 are adhered and fixed to each other via the adhesive sheet 25. In this state, parts of the upper surfaces of the plurality of busbars 20 are exposed through the openings 13 of the circuit board 12 and the sheet openings 26 of the adhesive sheet 25.

Then, solder is applied to predetermined positions of the circuit board 12 by screen printing. Then, the coils 15 are placed at the predetermined positions, and reflow soldering is performed.

Then, the adhesive agent 35 is applied to the upper surface of the heatsink 30, and the circuit board 12 on which the coils 15 and the plurality of busbars 20 are arranged is laid thereon from above. Since, at this time, the pair of cut-out portions 22 are formed at the edges of the plurality of busbars 20 that are opposite to each other in the regions of the openings 13 of the circuit board 12, the adhesive agent 35 that has entered the gaps S between the adjacent busbars 20 extends broadly and shallowly in the cut-out portions 22 (see FIG. 5). Thereafter, the adhesive agent 35 is cured by application of heat.

Lastly, the circuit board 12 (circuit assembly 11) laid on the heatsink 30 is accommodated in the case 40, and the electrical junction box 10 is formed.

The following will describe the functions and effects of the electrical junction box 10 according to the present embodiment. According to the present embodiment, the adhesive agent 35 that has entered the gap S between adjacent busbars 20 in the regions of the openings 13 of the circuit board 12 extends broadly and shallowly in the cut-out portions 22 of the busbars 20, and is prevented from getting into direct contact with the lower surfaces of the main bodies 16 of the coils 15. Accordingly, even if the adhesive agent 35 expands due to the heat of the coils 15 or the circuit board 12, or adversely contracts by being cooled, the main bodies 16 of the coils 15 are prevented from being directly affected thereby, making it difficult for a connection section between the busbar 20 and the lead terminal 17 to be affected. That is, it is possible to achieve a circuit assembly 11 and an electrical junction box 10 that have high connection reliability.

A configuration is also possible in which each pair of cut-out portions 22 are provided at positions of the plurality of busbars 20 that are opposite to each other in the region of the opening 13. Accordingly, it is possible to ensure a large area for the gap between adjacent busbars 20, preventing the adhesive agent 35 from getting into contact with the lower surfaces of the main bodies 16 of the coils 15.

Other Aspects

The technique disclosed by the present description is not limited to the embodiment described in the foregoing description and drawings, and encompasses, for example, the following various aspects.

The foregoing embodiment has a configuration in which the cut-out portions 22 are provided on both of the pair of busbars 20 that are exposed through the opening 13, but a configuration is also possible in which a cut-out portion 22 is provided on one of the pair of busbars 20.

Furthermore, in the case where the cut-out portions 22 are provided on both of the pair of busbars 20, the cut-out portions 22 are not necessarily provided at opposite positions, and may be provided at shifted positions. Furthermore, the cut-out portions 22 are provided in an asymmetric shape.

Furthermore, the positions, shape, and the number of the cut-out portions 22 are not limited to those of the foregoing embodiment, and may be changed suitably.

The foregoing embodiment has described an example in which the coils 15 are mounted, but the present invention is applicable to the case where, instead of the coils 15, other electronic components such as capacitors or shunt resistors are mounted.

The technique described in the present description relates to another embodiment of a circuit assembly and a connected busbar structure.

Circuit assemblies that include a busbar are conventionally known. JP 2012-235693A describes a circuit assembly that includes a circuit board, and a plurality of busbars that are arranged over the rear surface of the circuit board. The busbars have, at ends thereof, a plurality of tab-shaped terminal sections arranged in parallel. In manufacturing of this circuit assembly, a connected busbar structure is first formed in which the terminal sections of the plurality of busbars are connected to each other by tie bars. The circuit assembly is formed by cutting the tie bars.

However, the configuration in which the tie bars that connect the terminal sections are cut in order to form the circuit assembly needs to ensure such a size that a die for cutting the tie bars can advance between the terminal sections, and may interfere with downsizing of the circuit assembly.

The technique described in the present description was made in view of the above-described circumstances, and it is an object thereof to downsize the circuit assembly.

According to the technique described in the present description, a circuit assembly includes a circuit board that is made of an insulating plate on which an electrically conducting path is formed, and that is provided with a through-hole, and a busbar substrate that is laid on the circuit board, and includes a plurality of busbars made of plate-shaped metal, and cut sections formed by cutting a tie bar connecting the plurality of busbars, wherein the cut sections of the busbar substrate are formed at positions that are contiguous with the through-hole of the circuit board.

According to the technique described in the present description, a connected busbar structure includes a tie bar that connects a plurality of busbars made of plate-shaped metal such that the busbars can be cut, the connected busbar structure serving as a busbar substrate by being laid on a circuit board made of an insulating plate on which an electrically conducting path is formed and cutting the tie bar, wherein the tie bar is formed at a position that is contiguous with a through-hole formed in the circuit board.

According to the foregoing configuration, in manufacturing of the circuit assembly, it is possible to form the cut sections by cutting the tie bar using a die through the through-hole of the circuit board. Accordingly, the busbars that are connected to each other by a tie bar on the inside of the circuit board are not necessarily connected by a tie bar on the outside of the circuit board, and thus it is possible to reduce the number of the tie bars on the outside of the circuit board. Accordingly, it is possible to reduce the area of the portion of the busbar substrate that ensures such a size that a die for cutting the tie bar on the outside of the circuit board can advance. Accordingly, it is possible to downsize the circuit assembly.

The following aspects are preferable as aspects of the foregoing configuration.

Each busbar that has a cut section has a terminal section that is connectable to the outside, and the terminal sections are bent in the vicinity of an edge of the circuit board.

In a configuration in which, for example, terminal sections of a plurality of busbars are connected to each other by tie bars, and the tie bars are cut at the time of manufacturing of the circuit assembly, when the terminal sections are subjected to bending, it is efficient to perform cutting the tie bar and bending the terminal sections at the same time. However, when cutting the tie bar and bending the terminal sections are performed at the same time, it is not possible to bend the terminal sections in the vicinity of the edge of the circuit board since such a size that a die for cutting the tie bar can advance is ensured on the base end side of the terminal sections. In this case, there is the problem that the length of the terminal sections increases and downsizing of the circuit assembly is not possible.

By forming the cut sections at positions that are contiguous with a through-hole of the circuit board, the terminal sections can be bent in the vicinity of the edge of the circuit board, making it possible to reduce the length of the terminal sections and to downsize the circuit assembly.

An electronic component that has lead terminals to be connected to the busbars is provided, and the lead terminals are connected to the busbars having the cut sections through the through-hole.

Accordingly, since the through-hole of the circuit board through which a die or the like is passed when cutting the tie bars can be used for the connection of the electronic components, it is possible to increase the density of arrangement of the electronic components. Accordingly, it is possible to downsize the circuit assembly.

According to the technique described in the present description, it is possible to downsize the circuit assembly.

Hereinafter, Embodiment 2 will be described with reference to FIGS. 8 to 14.

A circuit assembly 210 may be arranged on a power supplying path between, for example, a power supply such as a battery of a vehicle such as an electric automobile, and a load constituted by an in-car electric component such as a lamp or a wiper, and may be used as, for example, a DC-DC converter, or an inverter.

Circuit Assembly 210

Figure 8:
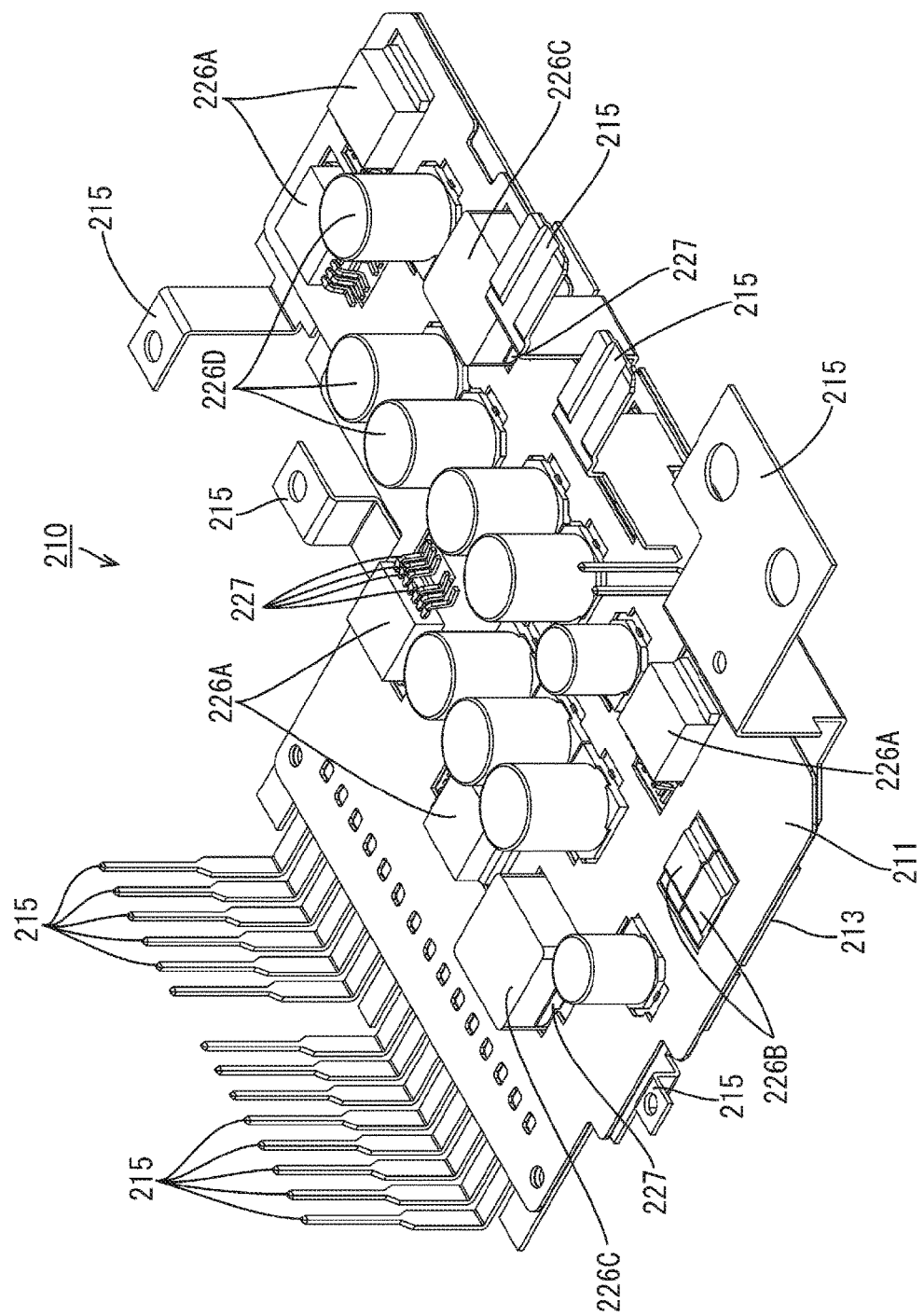
FIG. 8 is a perspective view illustrating a circuit assembly according to another embodiment described herein.

As shown in FIG. 8, the circuit assembly 210 includes a circuit board 211 that is made of an insulating plate on which an electrically conducting path is formed, a busbar substrate 213 that is made of plate-shaped metal and is laid on the circuit board 211, and electronic components 226A to 226D that are connected to the circuit board 211 and the busbar substrate 213.

The electronic components 226A to 226D include switching elements 226A made of a FET (Field Effect Transistor), shunt resistors 226B, coils 226C, capacitors 226D, and the like, and include lead terminals 227 that are connected to the electrically conducting path of the circuit board 211 or to busbars 214 by soldering. The lead terminals 227 of the coils 226C are L-shaped, and are arranged so as to extend along the bottom and side surfaces of the rectangular parallelepiped-shaped main portion.

Circuit Board 211

Figure 9:
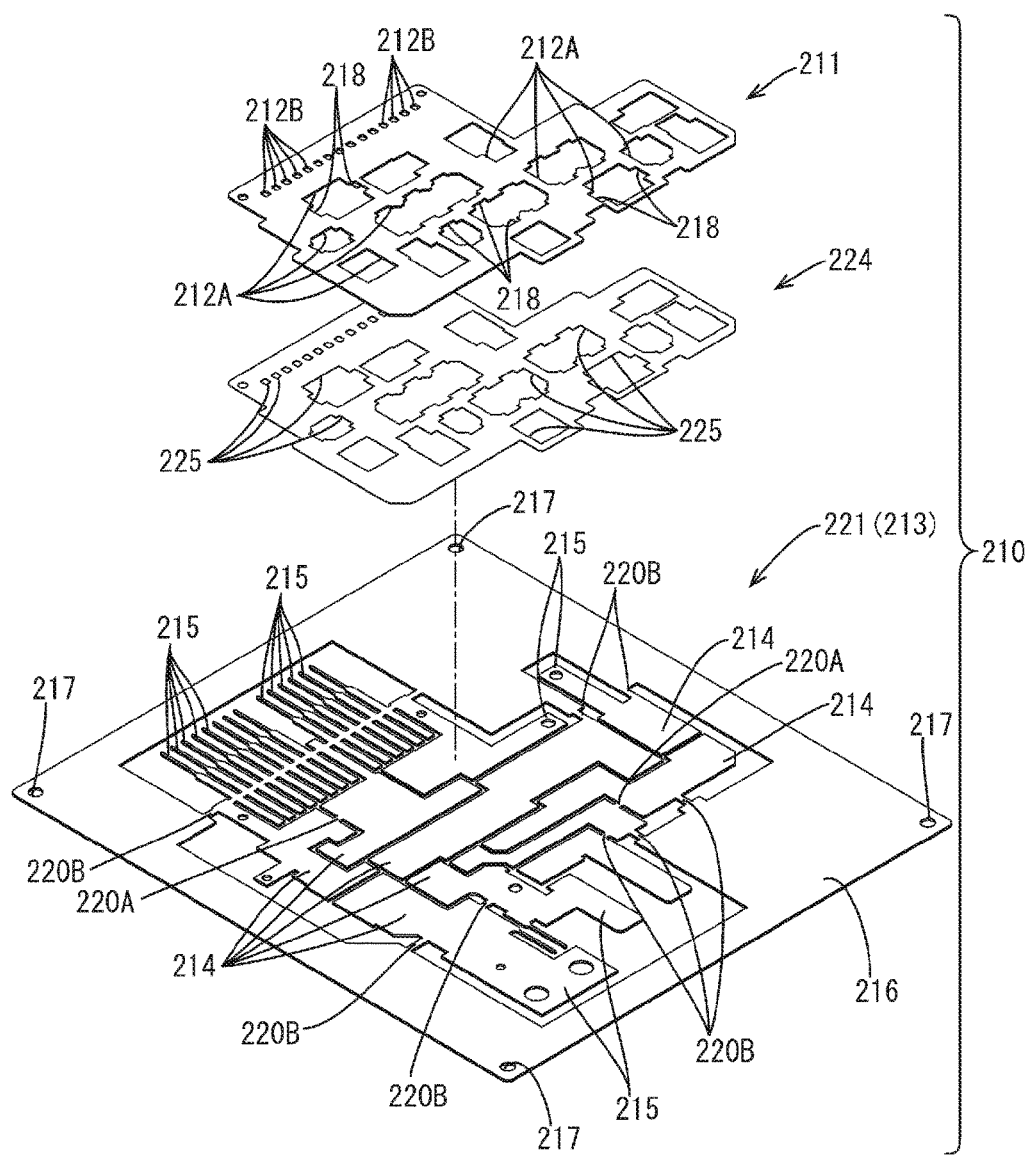
FIG. 9 is a perspective view illustrating an adhesive sheet and an insulating substrate being laid on busbars.

The circuit board 211 is made of an insulating plate made of an insulating material on which an electrically conducting path made of a copper foil (not shown) is printed and wired, and is adhered to the busbar substrate 213 via an adhesive sheet 224, as shown in FIG. 9. This circuit board 211 has a plurality of through-holes 212A and 212B that are formed through the circuit board 211. The plurality of through-holes 212A and 212B include the plurality of component insertion holes 212A through which the electronic components 226A to 226D are inserted, and the plurality of terminal insertion holes 212B through which a plurality of terminals (not shown) of other circuits are inserted.

The component insertion holes 212A have a shape and size that correspond to the shape and size on the bottom surface side of the electronic components 226A to 226D, and are rectangular shaped so that one or multiple electronic components 226A to 226D can be inserted therethrough. The component insertion holes 212A through which the coils 226C and the capacitors 226D are inserted are formed so as to have such a size that the outer circumferences on the bottom side of coils 226C and the capacitors 226D fit therein, and have cut-out portions 218 that are cut out conforming to the positions of the lead terminals 227. Solder fillets for soldering the lead terminals 227 are respectively formed on the inside of the cut-out portions 218.

The adhesive sheet 224 has substantially the same shape as the circuit board 211, an insulating adhesive agent is applied to it, and has through holes 225 at positions corresponding to the through-holes 212A and 212B.

Busbar Substrate 213

The busbar substrate 213 is made of metal such as copper or a copper alloy, and has the plurality of plate-shaped busbars 214 that are shaped in accordance with the shape of the electrically conducting path. The plurality of busbars 214 have terminal sections 215 that are obtained by bending portions arranged outside the outer circumference of the circuit board 211 in the shape of an L or a crank. Each terminal section 215 is to be connected to an external terminal, and is formed with a width and thickness that depend on the electric power.

Before assembling the circuit assembly 210, by punching a rectangular metal plate, the busbar substrate 213 is formed into a connected busbar structure 221 that includes the plurality of busbars 214, a frame body 216 arranged around the plurality of busbars 214, inner tie bars 220A (an example of the "tie bars") for connecting the plurality of busbars 214, and outer tie bars 220B for connecting the busbars 214 and the frame body 216. The frame body 216 of the connected busbar structure 221 has, at four corners thereof, holding holes 217 for holding the position of the connected busbar structure 221 that are formed through the frame body 216.

Figure 10:
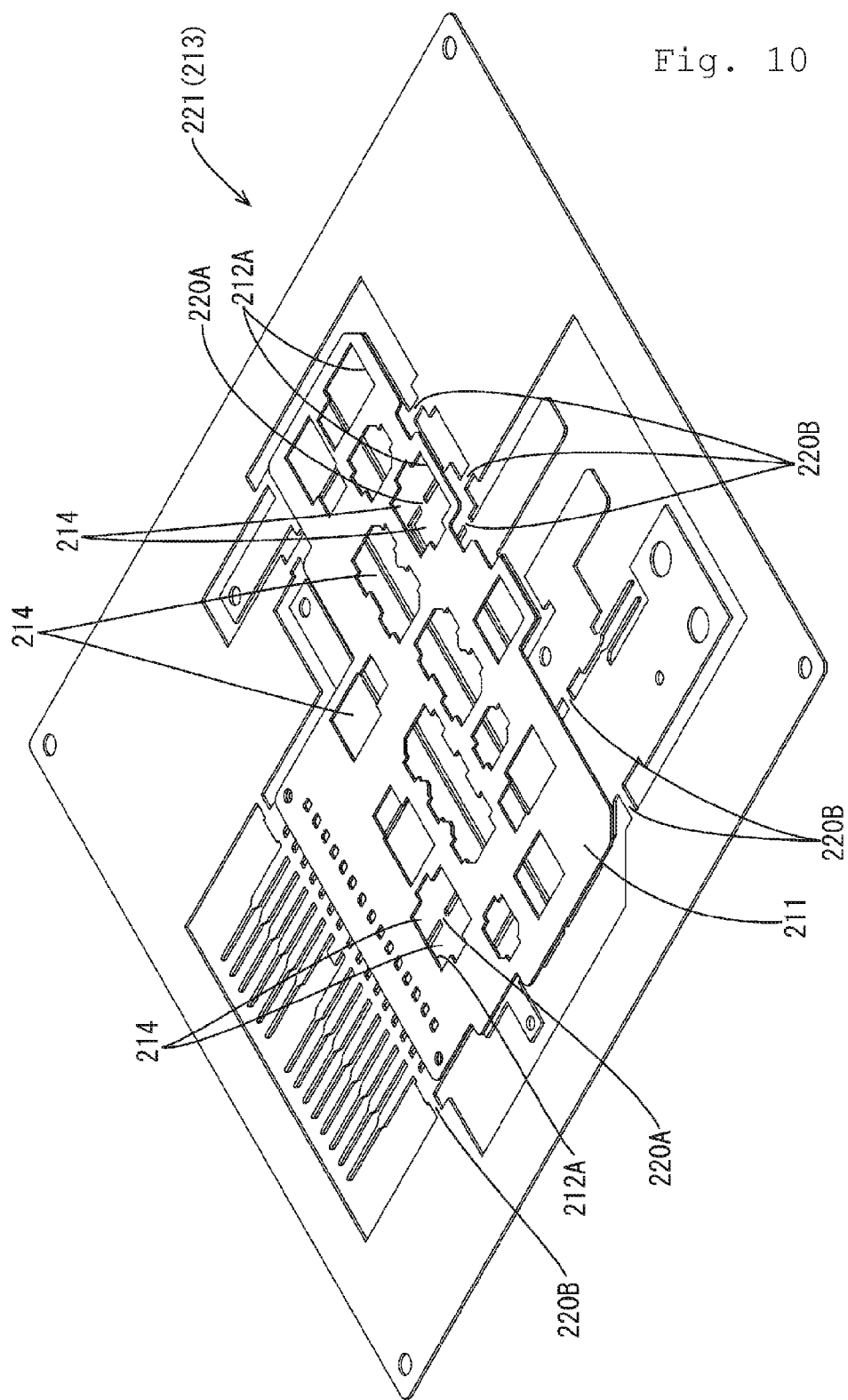
FIG. 10 is a perspective view illustrating the state in which the adhesive sheet and the insulating substrate are laid on busbars.
Figure 11:
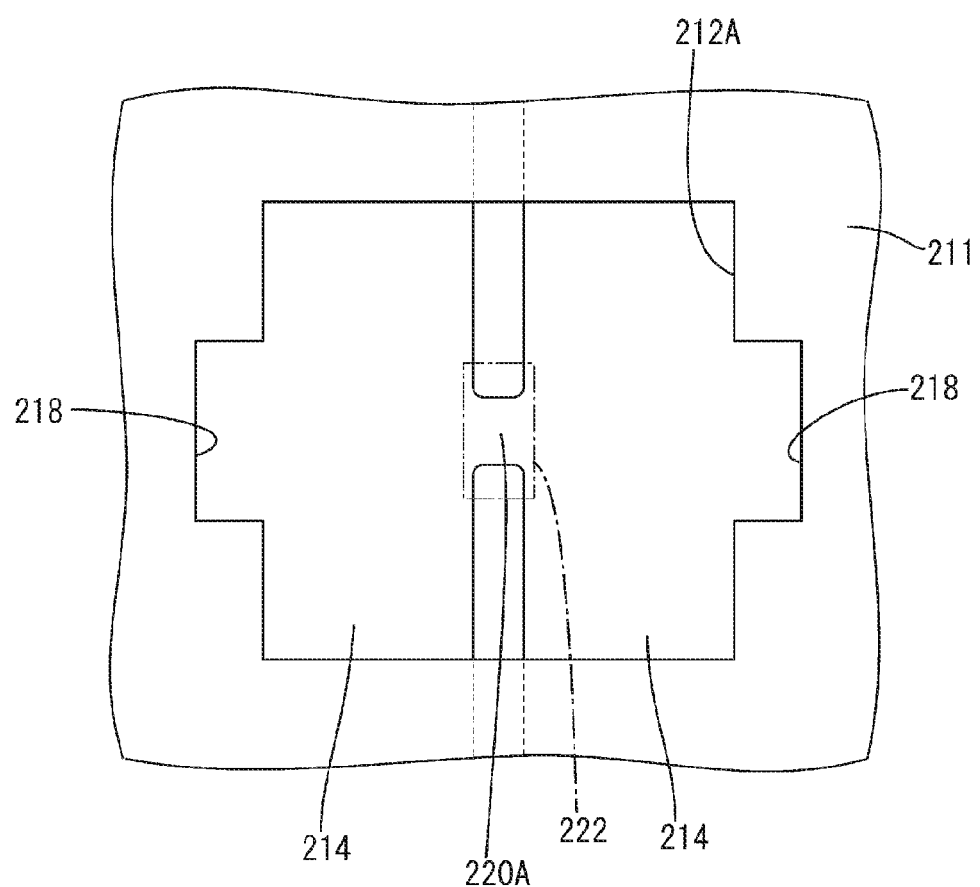
FIG. 11 is an enlarged plan view illustrating the part of FIG. 10 in which an inner tie bar is arranged in a component insertion hole.
Figure 12:
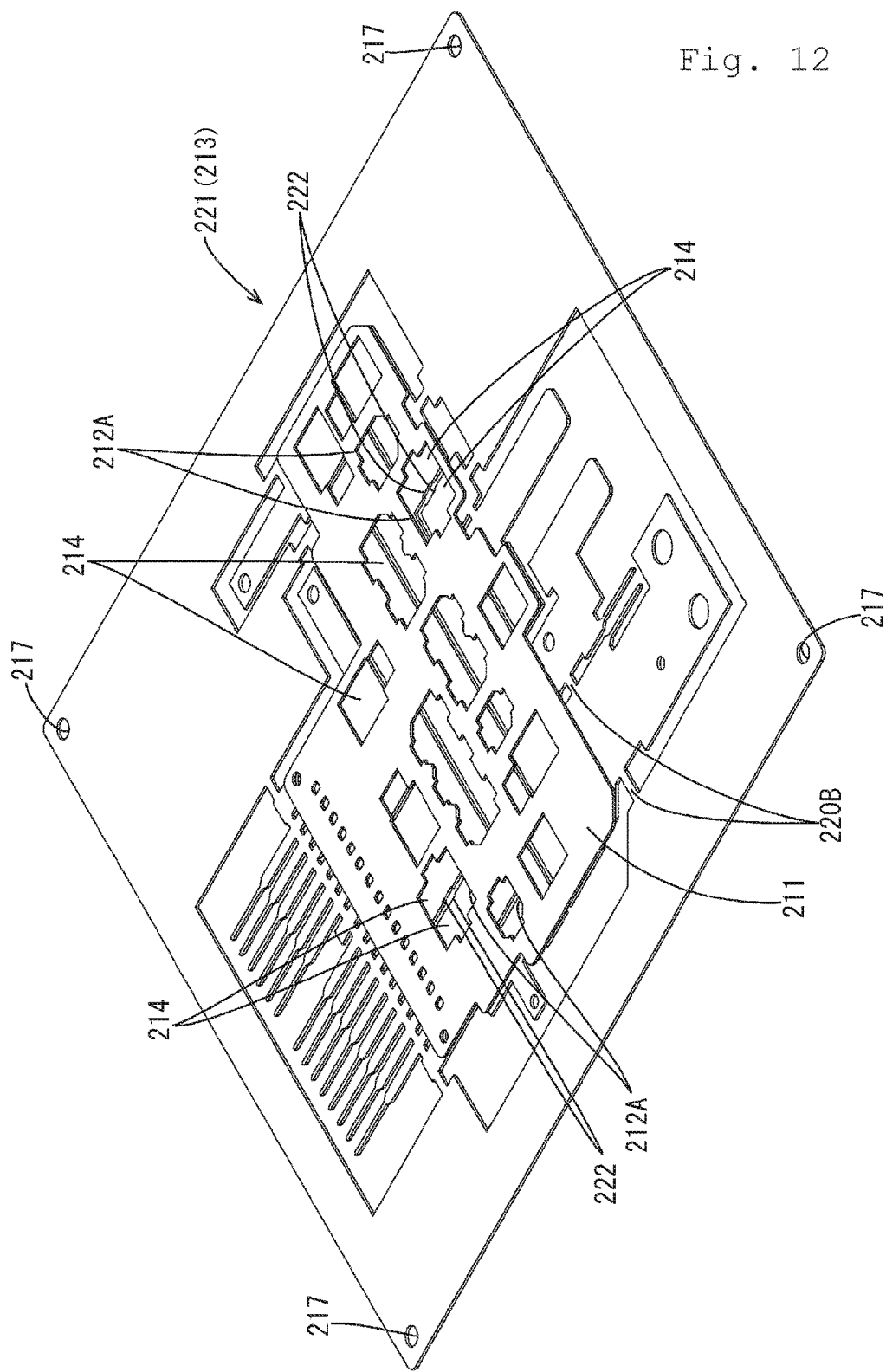
FIG. 12 is a perspective view illustrating the state in which the inner tie bars of FIG. 10 are cut.
Figure 13:
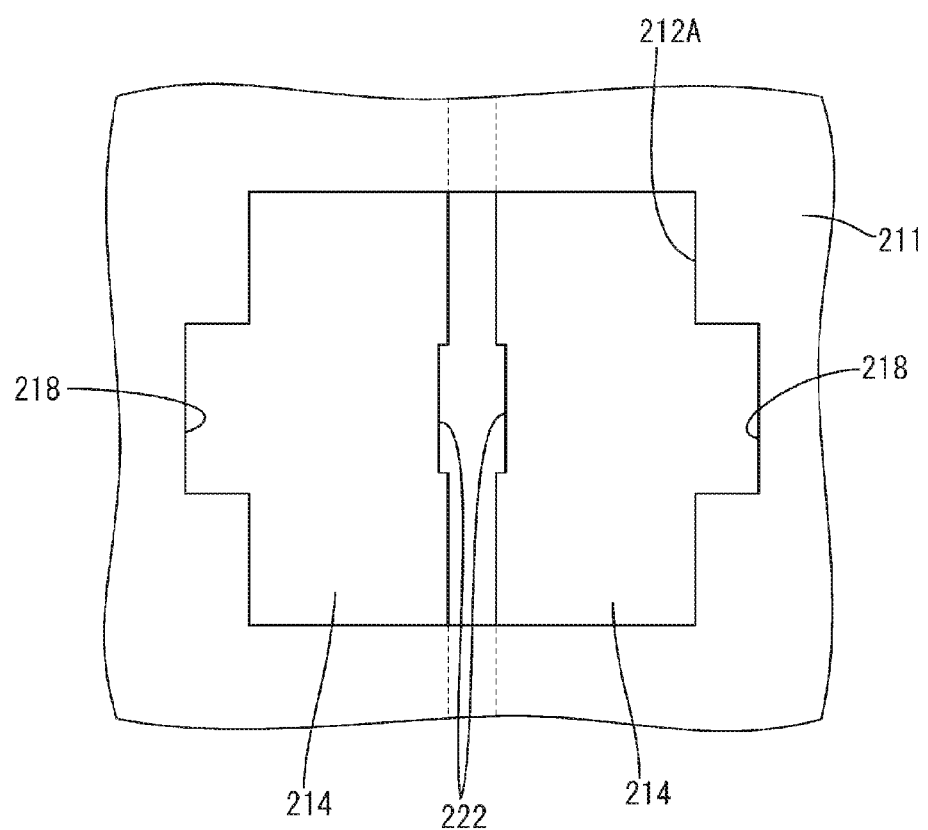
FIG. 13 is an enlarged plan view illustrating the part of FIG. 12 in which the inner tie bar in the component insertion hole is cut.

The inner tie bars 220A are arranged inward of the outer circumference of the circuit board 211 so as to connect the plurality of busbars 214, and are arranged below the component insertion holes 212A of the circuit board 211 through which the coils 226C are inserted (positions that are contiguous with the through-holes), as shown in FIGS. 10 and 11. By cutting the inner tie bars 220A before the electronic components 226A to 226D are mounted, cut sections 222, which are cut end surfaces of the inner tie bars 220A, are formed, as shown in FIGS. 12 and 13. That is, in the state in which the busbar substrate 213 is assembled into the circuit assembly 210, the busbar substrate 213 includes the cut sections 222, which are formed by cutting the inner tie bars 220A. The cut sections 222 are the cut end surfaces of the inner tie bars 220A that are cut by a die, and the side surfaces of the busbars 214 are cut in a step-like manner with a predetermined size.

The outer tie bars 220B are arranged outward of the outer circumference of the circuit board 211 so as to connect the busbars 214 and the frame body 216, and are cut after the electronic components 226A to 226D are mounted. When the outer tie bars 220B are cut by a die, the terminal sections 215 of the busbars 214 are bent at the same time. The cut end surfaces of the outer tie bars 220B are formed smoothly along the outer circumference of the busbars 214 and the terminal sections 215.

The following will describe a method for manufacturing the circuit assembly 210.

As shown in FIG. 9, the connected busbar structure 221 is formed by punching a metal plate, the adhesive sheet 224 and the circuit board 211 are laid on the connected busbar structure 221 at a predetermined position thereof, and the circuit board 211 is fixed to the connected busbar structure 221 (FIG. 10). In this state, the inner tie bars 220A that connect adjacent busbars 214 are exposed through the component insertion holes 212A of the circuit board 211.

Figure 14:
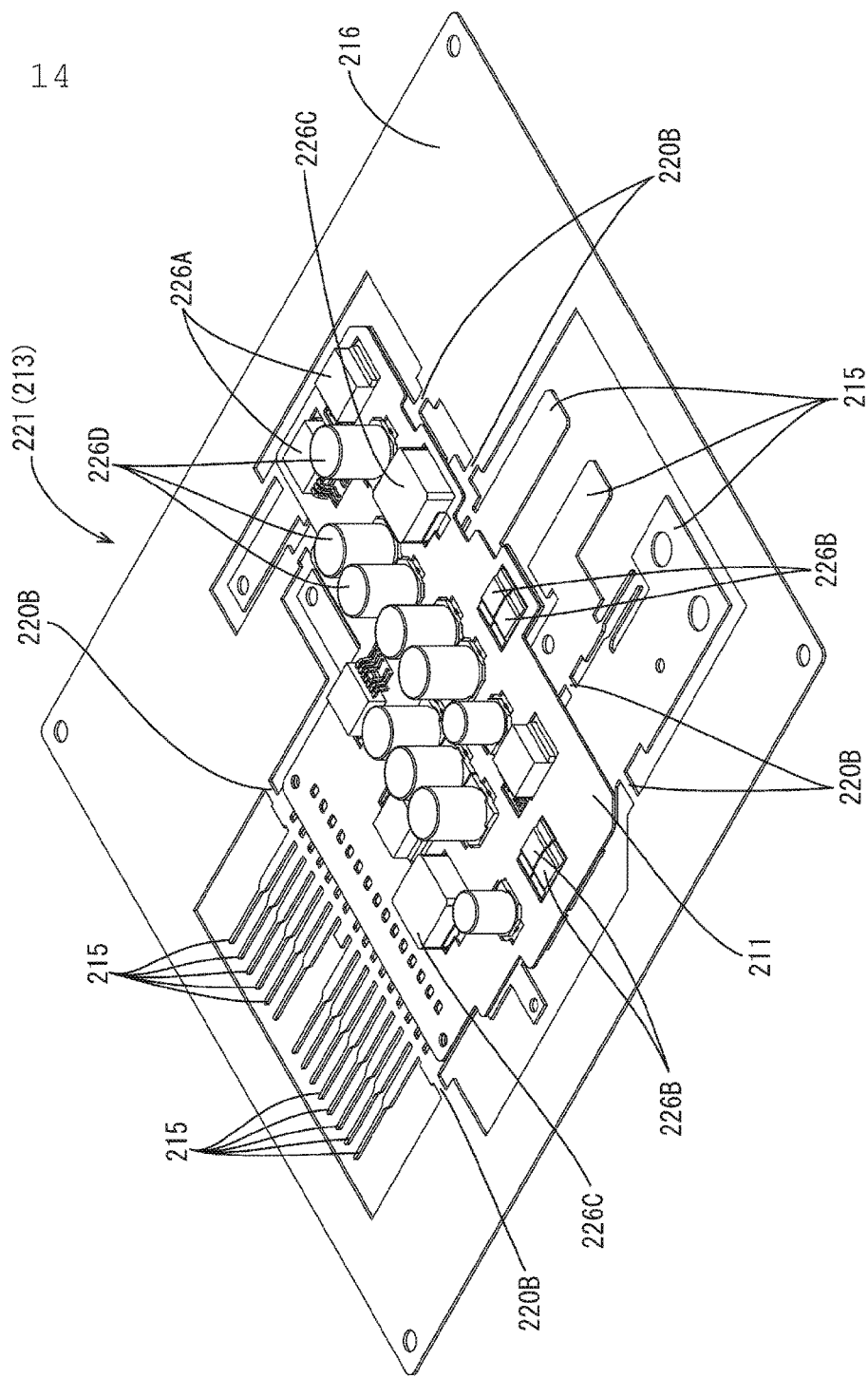
FIG. 14 is a perspective view illustrating the state in which electronic components are soldered in the state of FIG. 12.

Then, the inner tie bars 220A are cut using a die, and the cut sections 222 are formed (FIG. 12). Then, the lead terminals 227 of the electronic components 226A to 226D are connected to the circuit board 211 and the busbars 214 by, for example, reflow soldering (FIG. 14).

Also, the frame body 216 is separated by cutting the outer tie bars 220B using a die and bending the terminal sections 215 at the same time, and the circuit assembly 210 is formed (FIG. 8).

A heat discharging member made of a metal material such as an aluminum alloy that has high heat conductivity is laid on this circuit assembly 210, for example, the lower surfaces of the busbars 214, via an insulating adhesive agent. Then, the circuit assembly 210 is disposed in a case made of a synthetic resin, and is then installed as an electrical junction box in a vehicle.

According to the present embodiment, the following functions and effects are achieved.

According to the present embodiment, at the time of manufacturing the circuit assembly 210, the cut sections 222 can be formed by cutting the inner tie bars 220A (tie bars) using a die through the component insertion holes 212A (through-holes) of the circuit board 211. Accordingly, as compared to the case where cut sections are formed only on the outside of the circuit board 211, the busbars 214 whose cut sections 222 are formed on the inside of the circuit board 211 do not necessarily have a cut section on the outside of the circuit board 211. Accordingly, the number of the outer tie bars 220B can be reduced, thus making it possible to reduce the area of the portion of the busbar substrate 213 for which such a size on the outside of the circuit board 211 is ensured that a die for cutting a tie bar can advance. Accordingly, it is possible to downsize the circuit assembly 210.

Furthermore, the electronic components 226A to 226D that have the lead terminals 227 to be connected to the busbars 214 are provided, and the lead terminals 227 are connected to the busbars 214 having the cut section 222 via the component insertion holes 212A (through-holes).

Accordingly, since the through-holes of the circuit board 211 through which a die is to be passed when cutting the inner tie bars 220A can be used for connection of the electronic components 226C, it is possible to increase the density of arrangement of the electronic components 226A to 226D. Accordingly, it is possible to downsize the circuit assembly 210.

Embodiment 3

Hereinafter, another embodiment of a circuit assembly and an electrical junction box will be described with reference to FIGS. 15 to 18.

Figure 15:
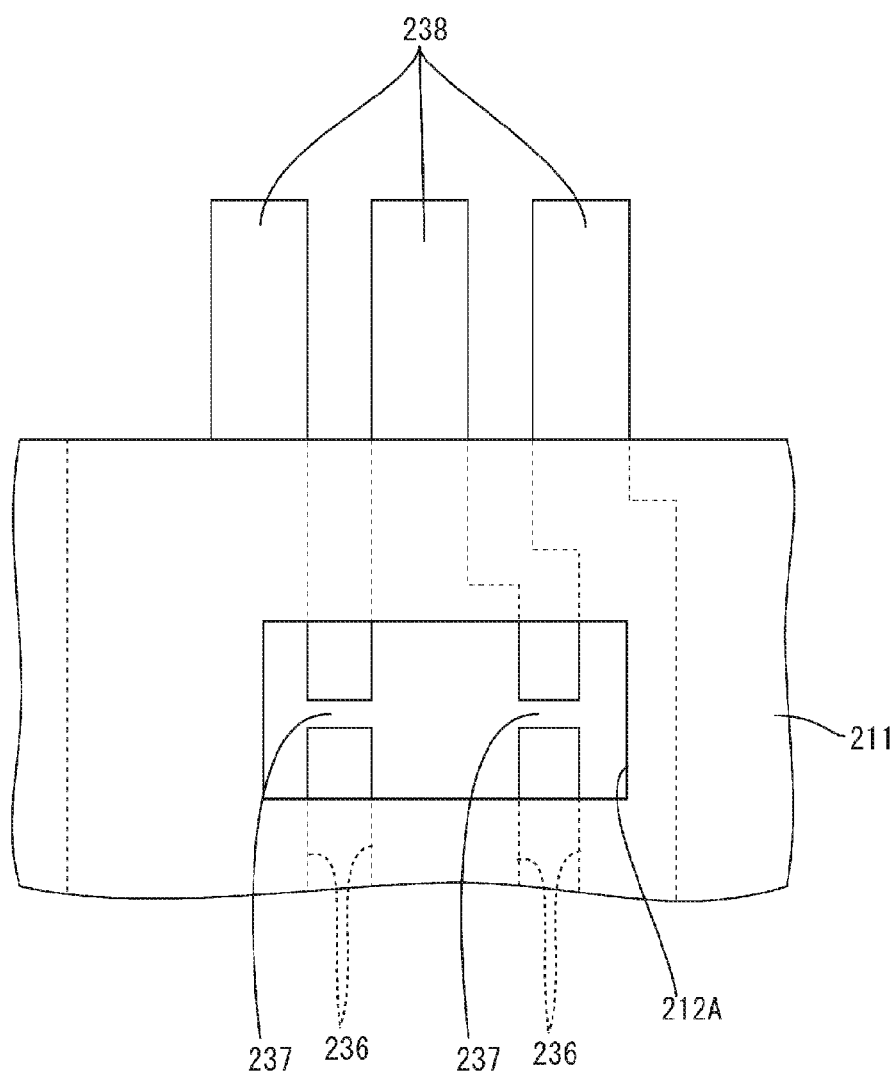
FIG. 15 is an enlarged diagram of according to one or more embodiments described herein illustrating the state in which busbars are connected to each other by tie bars.

As shown in FIG. 15, the embodiment of a circuit assembly and an electrical junction box relates to an embodiment in which the connected busbar structure 221 in which the busbars 214 are connected to each other by inner tie bars 237 do not have a cut section in their terminal sections and are not connected by outer tie bars. Descriptions of the same configurations as those of the foregoing embodiments will be omitted.

Figure 17:
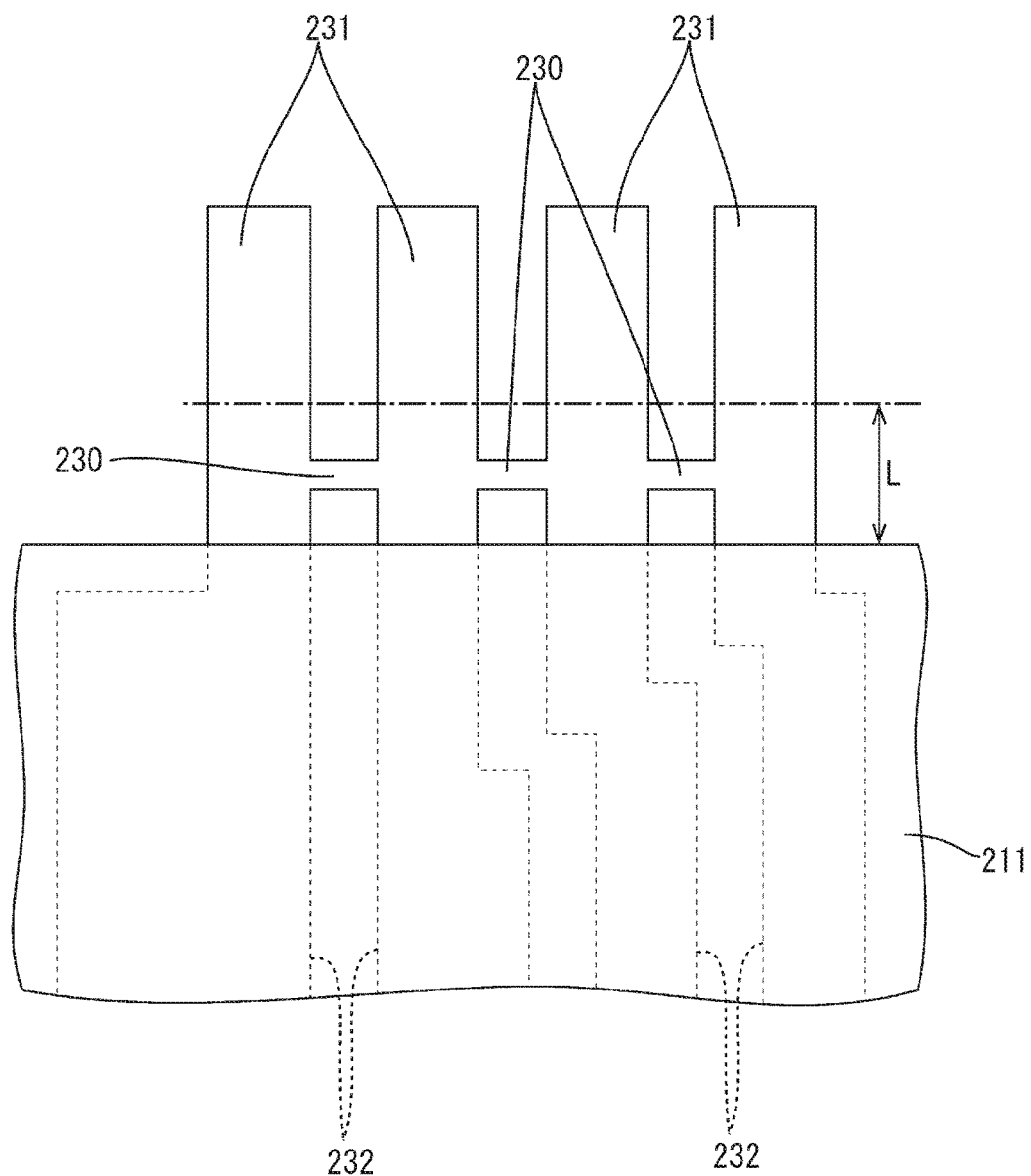
FIG. 17 is an enlarged diagram illustrating the state in which terminal sections are connected to one another by tie bars, according to a comparative example.
Figure 18:
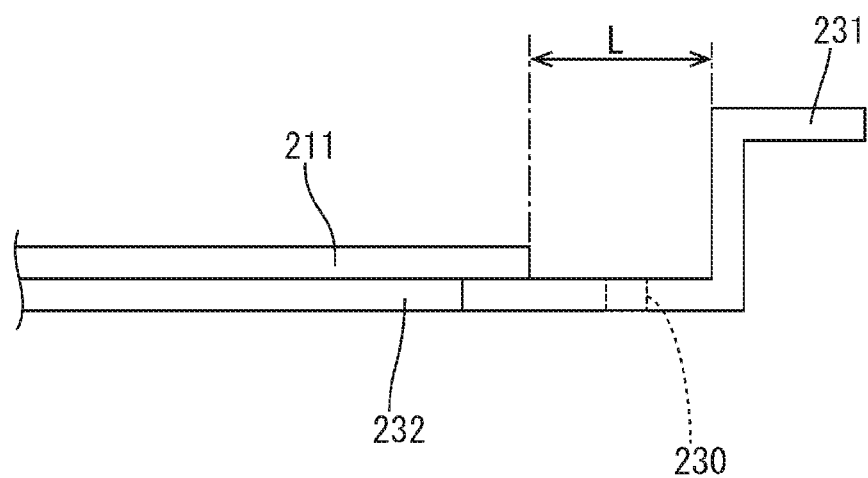
FIG. 18 is a diagram illustrating the state in which the terminal section is subjected to bending, according to a comparative example.

As shown in comparative examples of FIGS. 17 and 18, the terminal sections 231 of the plurality of busbars 232 are connected to each other by the outer tie bars 230, and in the case where the outer tie bars 230 are cut and the terminal sections 231 are bent during manufacturing the circuit assembly 210, it is efficient to cut the outer tie bars 230 and bend the terminal sections 231 at the same. However, when cutting the outer tie bars 230 and bending the terminal sections 231 are performed at the same, it is not possible to bend the terminal sections 231 in the vicinity of the edge of the circuit board 211 since such a size L is ensured on the base end side of the terminal sections 231 that the die for cutting the outer tie bars 230 can advance, and the terminal sections 231 are bent at positions apart from the edge of the circuit board 211 by the size L. In this case, there is the problem that the need of the size L increases the length of the terminal sections 231 and makes it impossible to downsize the circuit assembly.

Figure 16:
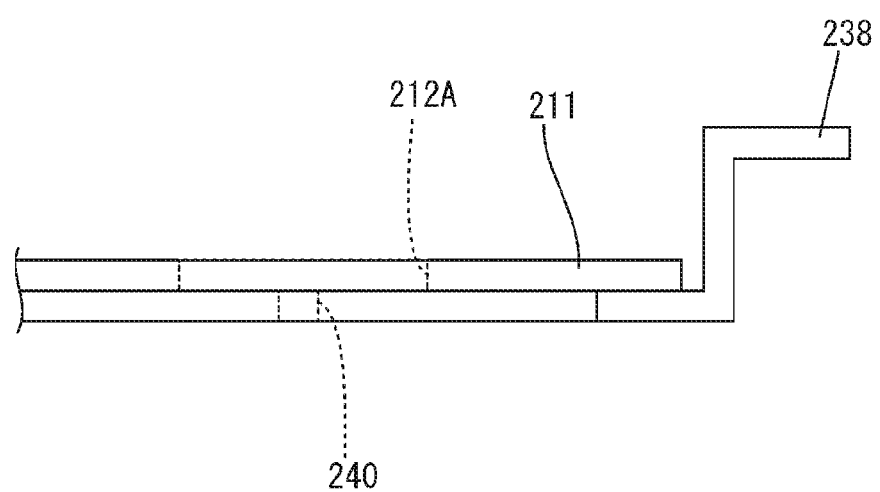
FIG. 16 is a diagram illustrating the state in which a terminal section is subjected to bending.

According to the present embodiment, as shown in FIGS. 15 and 16, the plurality of adjacent busbars 236 are connected to each other by the inner tie bars 237, and terminal sections 235 (that are not connected by outer tie bars 220B) are formed on the busbars 236 connected by the inner tie bars 237. Since the inner tie bars 220 are arranged below the component insertion holes 212A (positions that are contiguous with the through-holes), cut sections 240 obtained by cutting the inner tie bars 220A are also arranged below the component insertion hole 212A.

Since the outer tie bars do not need to be cut in order to form the terminal sections 238, it is not necessary to ensure such a size from the edge of the circuit board 211 that the die for cutting the outer tie bars can advance. Accordingly, it is possible to bend the terminal sections 238 in the vicinity of the edge of the circuit board 211, eliminating the need of increasing the length of the terminal sections 238 for the bending of the terminal sections 238. It is therefore possible to downsize the circuit assembly.

Other Aspects

The technique described in the present description is not limited to the embodiments described with reference to the foregoing description and drawings, and the technical scope of the technique described in the present description may encompass, for example, the following aspects:

(1) The positions and the number of the inner tie bars 220A are not limited to the positions and the number of the foregoing embodiment. Furthermore, it is possible to form a suitable number of the cut sections 222 at suitable positions according to the inner tie bars 220A.

(2) The cut sections 222 and 240 may not necessarily have a shape in which sides of the busbars are cut out. For example, the cut sections may be formed so as to be co-planar with sides of the busbars.

(3) The circuit board may have, in addition to the component insertion holes 212A, through-holes for cutting the cut sections 222 and 240 using a die.

The technique described in the present description relates to another embodiment of a circuit assembly and an electrical junction box.

Circuit assemblies that include various types of electronic components, a circuit board, and busbars that are laid on the circuit board are conventionally known (see, for example, JP 2013-99071A). In such circuit assemblies, various types of electronic components are connected by a method such as soldering.

Figure 24:
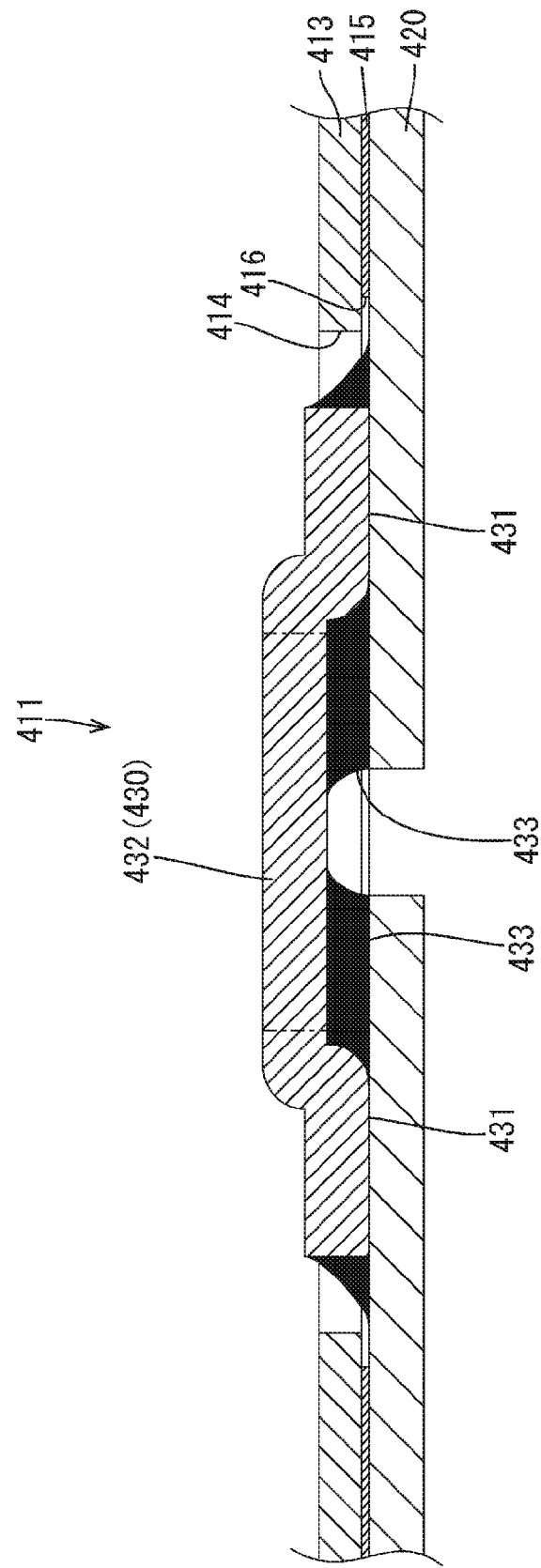
FIG. 24 is a partial cross-sectional view illustrating a conventional circuit assembly.

Examples of the electronic components to be connected to the circuit assembly include a relay and a shunt resistor. Since among such electronic components, the shunt resistor is entirely made of a metal material, if the busbars are soldered, the solder 433 wets and extends (expands), and may reach a resistor section 432, as shown in FIG. 24. In such a case, there is the problem that an inappropriate shape of the soldered section may cause the solder crack due to thermal impulse of a cooling/heating cycle, resulting in a reduction in electrical connection reliability.

It is an object of the technique described in the present description to enhance the electrical connection reliability of a circuit assembly that includes a shunt resistor.

According to the technique described in the present description, a circuit assembly includes a circuit board that has an opening, busbars that are laid on one surface side of the circuit board, and a shunt resistor that has connection terminal sections that are connected to the busbars in the opening of the circuit board by soldering, and a resistor section that is contiguous to the connection terminal sections, wherein solder fillets that connect the shunt resistor and the busbars are formed closer to the connection terminal sections than to the resistor section.

Furthermore, according to the technique described in the present description, an electrical junction box includes the above-described circuit assembly, and a case in which the circuit assembly is accommodated.

In the technique described in the present description, the solder fillets that connect the shunt resistor and the busbars are formed closer to the terminal sections of the shunt resistor than to the resistor section thereof, and thus a designed resistance value can be obtained.

If, as shown in FIG. 24, the solder 433 wets and extends to the resistor section 432 of the shunt resistor, and fills up the space between the resistor section 432 and the busbars 420, there will be a risk that a solder crack is likely to occur due to thermal impulse of a cooling/heating cycle. However, according to the technique described in the present description, the solder fillets that connect the shunt resistor and the busbars are formed closer to the terminal sections of the shunt resistor than to the resistor section thereof, and thus solder that fills up the space between the resistor section and the busbar is not likely to be formed, and a solder crack is not likely to occur even under the thermal impulse of a cooling/heating cycle, improving electrical connection reliability.

The technique described in the present description may have the following configurations:

Cut-out portions are formed in areas of the busbars that overlap the resistor section of the shunt resistor, and ends of the cut-out portions may be set to be closer to the connection terminal sections than to the resistor section.

By making such a configuration, the busbars are cut out to the vicinity of the connection terminal sections of the shunt resistor, and thus it is possible to reliably prevent the solder from wetting and extending to the resistor section.

According to the technique described in the present description, it is possible to improve the electrical connection reliability of a circuit assembly including a shunt resistor.

Hereinafter, the electrical junction box 10 including the circuit assembly 11 according to Embodiment 4 will be described with reference to FIGS. 19 to 23.

An electrical junction box 310 of the present embodiment is provided with a circuit assembly 311 that includes a circuit board 313 and busbars 320, and a case 312 that is made of a synthetic resin and in which the circuit assembly 311 is accommodated. Note that in the following description, the upper side of FIG. 23 refers to "front side" or "upper side", and the lower side of FIG. 23 refers to "rear side" or "lower side".

Figure 19:
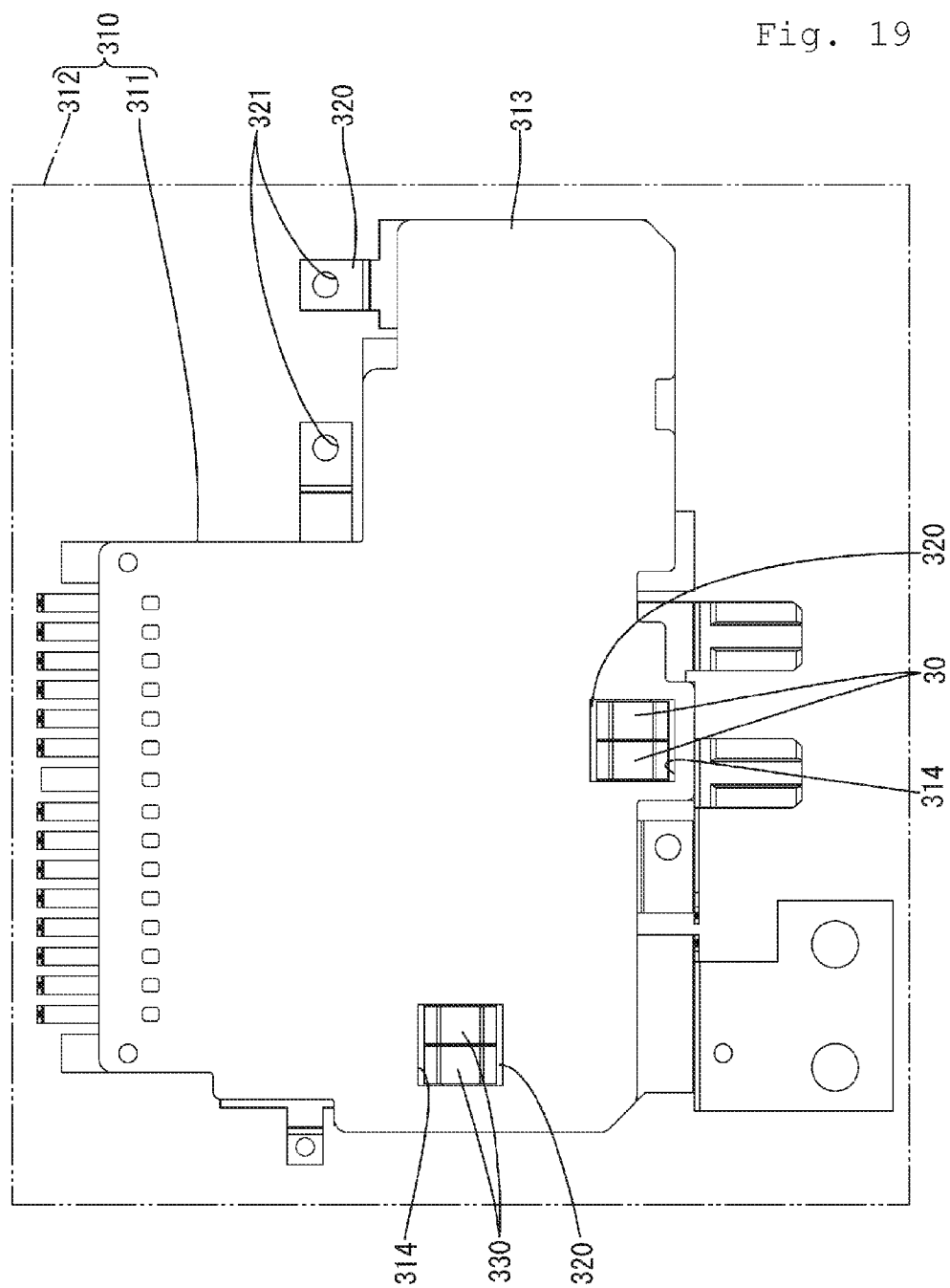
FIG. 19 is a plan view illustrating an electrical junction box according to one or more embodiments described herein.
Figure 21:
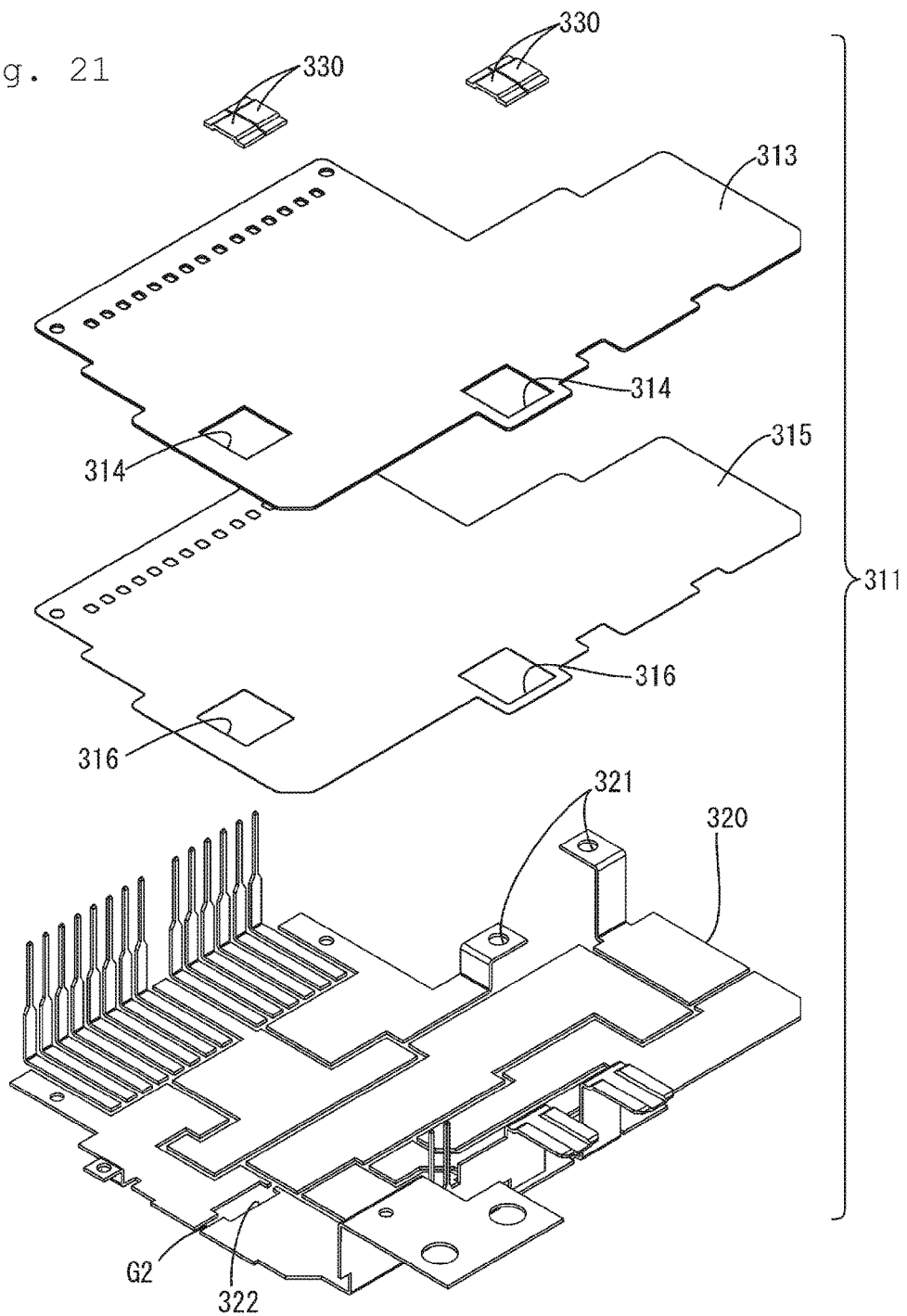
FIG. 21 is an exploded perspective view of a circuit assembly.

As shown in FIGS. 19 and 21, the circuit assembly 311 includes the circuit board 313, shunt resistors 330 arranged on the front surface (upper side of the FIG. 21) of the circuit board 313, and a plurality of busbars 320 that are adhered to the rear surface (lower side of FIG. 21) of the circuit board 313 via an adhesive sheet 315.

Circuit Board 313

The circuit board 313 is substantially L-shaped in a top view, and has, on its front surface, an electrically conducting path that is not shown and is achieved by printed wiring.

Figure 22:
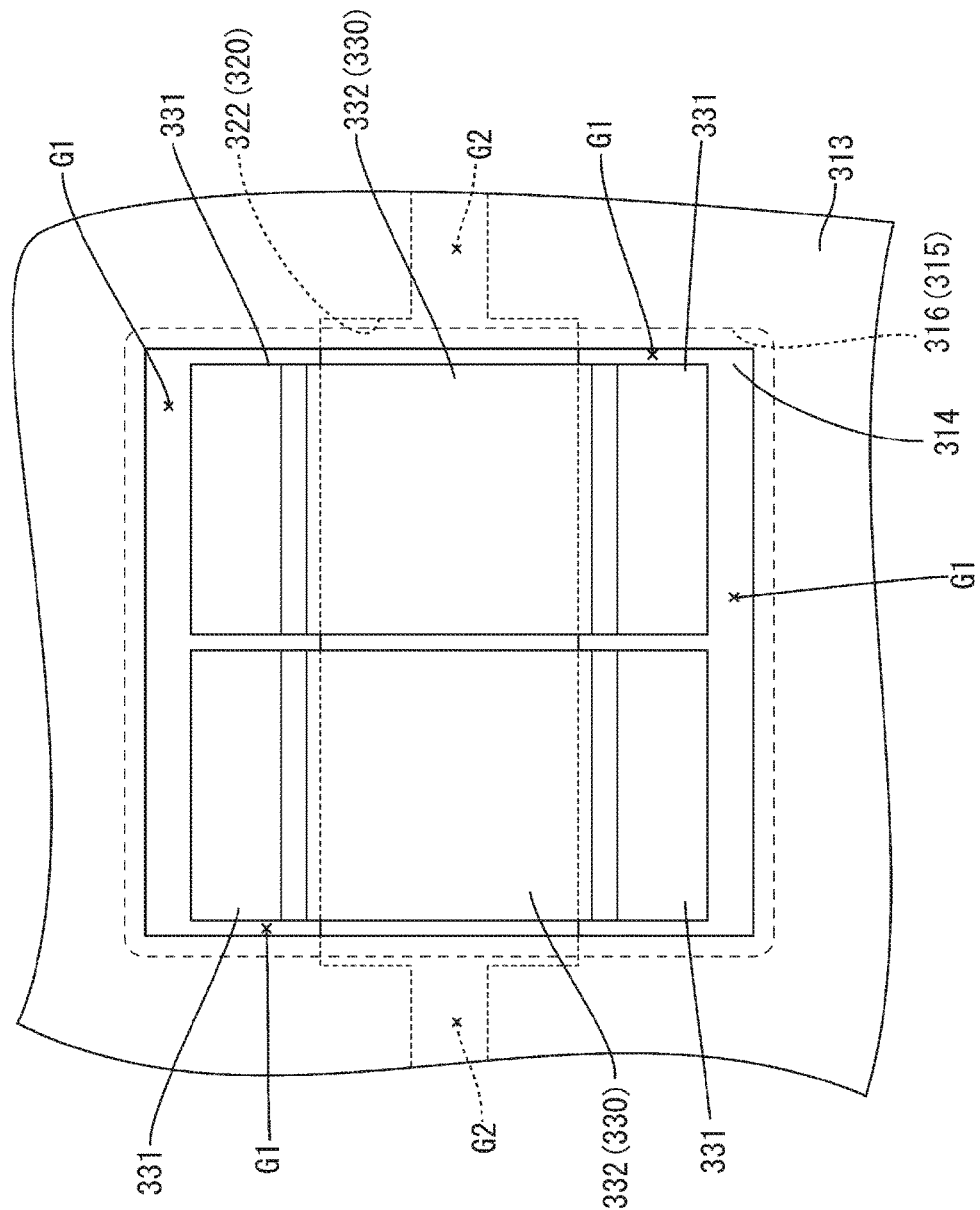
FIG. 22 is an enlarged plan view illustrating the main part in the state in which the shunt resistors are connected to the busbars.

The circuit board 313 has, at positions at which the shunt resistors 330 are arranged, openings 314 each for connecting two shunt resistors 330 to the busbars 320. As shown in FIG. 22, each opening 314 is open in the shape of a rectangle, and the two shunt resistors 330 are arranged such there is a gap G1 between the two shunt resistors 330 and the edges of the opening.

Adhesive Sheet 315

The adhesive sheet 315 is made of an insulating material, and has substantially the same shape and size as those of the circuit board 313. As shown in FIG. 22, the adhesive sheet 315 has, at positions that correspond to the openings 314 of the circuit board 313, sheet openings 316 that are each larger than the circumference of the opening 314 of the circuit board 313.

Busbar 320

The plurality of busbars 320 are formed by pressing a metal plate into predetermined shapes. The busbars 320 are arranged in a predetermined pattern with a gap G2 between adjacent busbars 320. Some of the plurality of busbars 320 have a bolt insertion hole 321 through which a bolt is to be inserted, and are connected to an external power supply via the bolt.

Of the plurality of busbars 320, the busbars 320 to which the shunt resistors 330 are connected have cut out portions that are dimensioned so as to conform to the resistor sections 332 of the shunt resistors 330 (hereinafter, referred to as "cut-out portions 322"). As shown in FIG. 22, the cut-out portions 322 are provided by cutting rectangles from two busbars 320. The cut-out portions 322 are contiguous with (communicate with) the gaps G2 between the two busbars 320.

Figure 23:
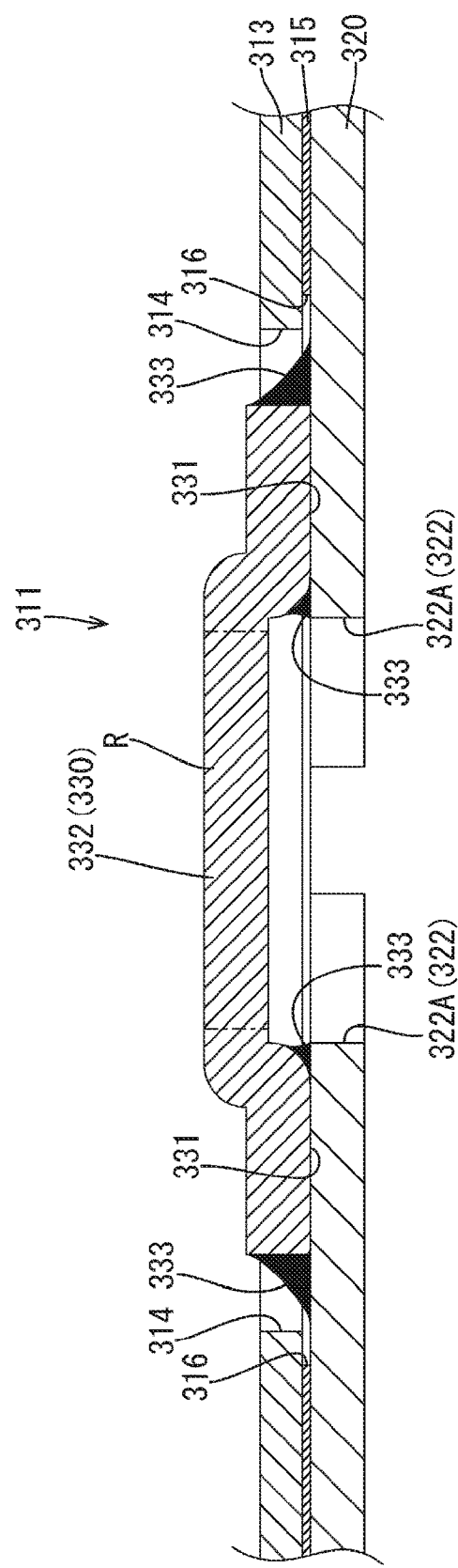
FIG. 23 is a partial cross-sectional view taken along the line A-A of FIG. 22.

As shown in FIG. 23, ends 322A of the cut-out portions 322 that are formed in the busbars 320 to which the shunt resistors 330 are connected are set to be closer to the connection terminal sections 331 of the shunt resistors 330 than to the resistor sections 332 thereof, and the cut-out portions 322 are provided entirely over the sections that overlap the resistor sections 332.

Shunt Resistor 330

The shunt resistors 330 are arranged in the openings 314 of the circuit board 313, and are connected to the busbars 320 by soldering. In the present embodiment, two shunt resistors 330 are provided for each opening 314 of the circuit board 313.

Each shunt resistor 330 includes a connection terminal sections 331 connected to the busbars 320, and a resistor section 332 that is contiguous to the connection terminal sections 331. As shown in FIG. 23, the resistor section 332 of each shunt resistor 330 forms a flat surface protruding upward. In FIG. 23, the resistor section 332 is provided in a region R between two dotted lines. The connection terminal sections 331 are respectively provided contiguously to both ends of the resistor section 332 of the shunt resistor 330.

In the present embodiment, the solder fillets 333 that connect the shunt resistors 330 and the busbars 320 are formed closer to the connection terminal sections 331 of the shunt resistors 330 than to the resistor sections 332 thereof.

Method for Manufacturing Electrical Junction Box 310

Hereinafter, an example of a method for manufacturing the electrical junction box 310 according to the present embodiment will be described.

Figure 20:
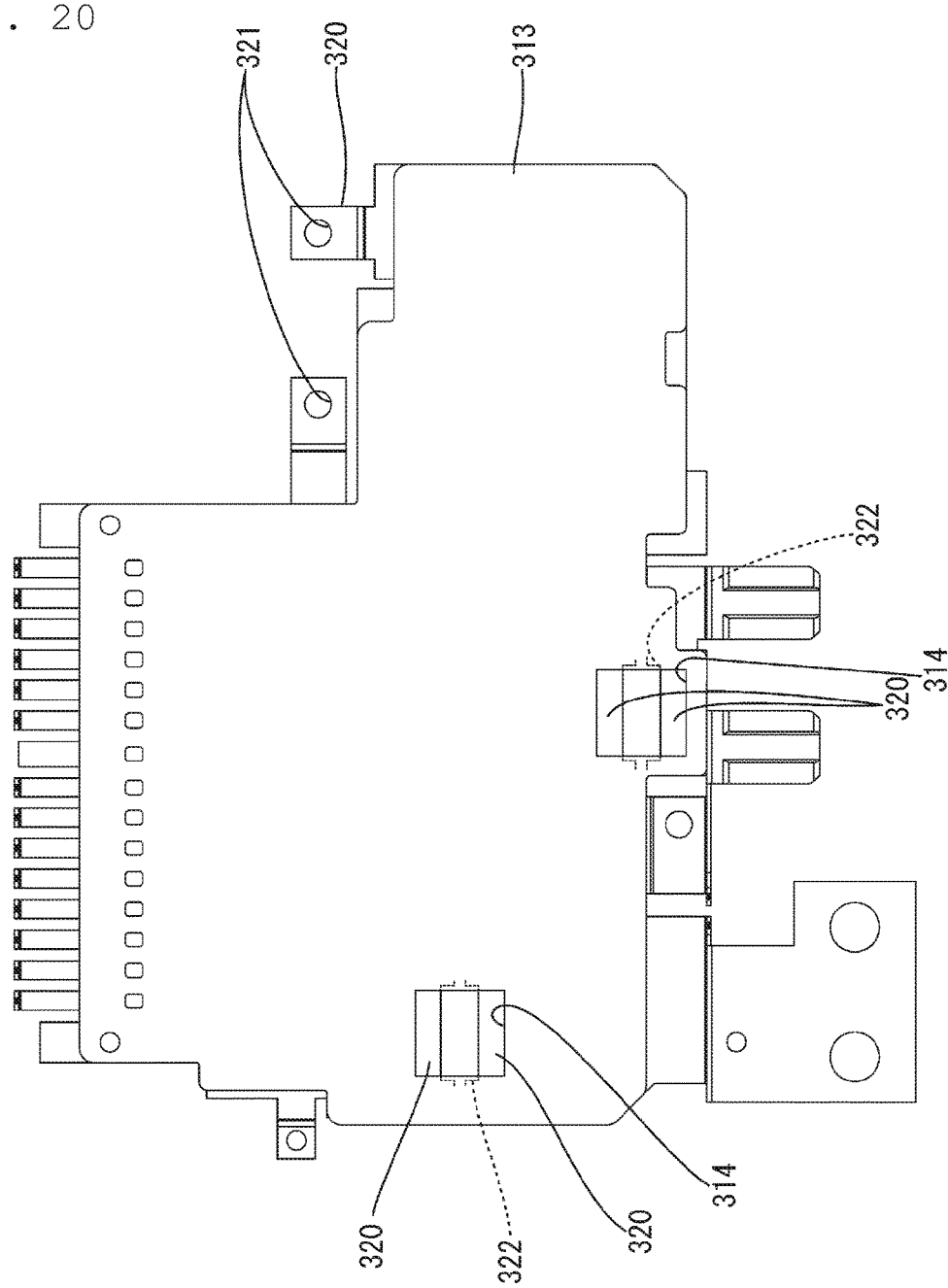
FIG. 20 is a plan view illustrating a circuit board before shunt resistors are connected thereto.

The adhesive sheet 315 that is cut in a predetermined shape is laid on the lower surface of the circuit board 313 on whose front surface an electrically conducting path is formed by printed wiring, and the plurality of busbars 320 arranged in a predetermined pattern are pressed thereto. Accordingly, the circuit board 313 and the plurality of busbars 320 are adhered and fixed to each other via the adhesive sheet 315, and as shown in FIG. 20, some of the busbars 320 are exposed through the openings 314 of the circuit board 313 and the sheet openings 316 of the adhesive sheet 315.

Then, by applying solder to predetermined positions of the circuit board 313, placing two shunt resistors 330 on the busbars 320 that are exposed through each opening 314 of the circuit board 313, and putting the assembly into a reflow oven so that it is subjected to soldering, it is possible to obtain the circuit assembly 311. In this circuit assembly 311, as shown in FIG. 23, the solder fillets 333 that connect the shunt resistors 330 and the busbars 320 are formed closer to the connection terminal sections 331 than to the resistor section 332.

The circuit assembly 311 obtained in this manner is accommodated in the case 312, and thereby the electrical junction box 310 of the present embodiment can be obtained.

Functions and Effects of the Present Embodiment

Hereinafter, the functions and effects of the present embodiment will be described.

If, as with the conventional example shown in FIG. 24, the solder 433 that connects the shunt resistor 430 and the busbars 420 wets and extends to not only the connection terminal sections 431 but also to the resistor section 432, and is formed so as to fill up the spaces between the resistor section 432 and the busbars 420, an inappropriate shape of the soldered section may cause a solder crack due to thermal impulse of a cooling/heating cycle. In FIG. 24, the reference numeral 411 denotes a circuit assembly, the reference numeral 413 denotes a circuit board, the reference numeral 414 denotes an opening of the circuit board, the reference numeral 415 denotes an adhesive sheet that connects the circuit board and the busbars, and the reference numeral 416 denotes a sheet opening.

In contrast, in the present embodiment, the solder fillets 333 that connect the shunt resistors 330 and the busbars 320 are formed in an appropriate shape at positions closer to the terminal sections of the shunt resistors 330 than to the resistor sections thereof.

According to the present embodiment, it is thus possible to obtain a designed resistance value. Furthermore, according to the present embodiment, since the solder fillets that connect the shunt resistors 330 and the busbars 320 are not likely to fill up the space between the resistor sections 332 of the shunt resistors and the busbars 320, a solder crack is not likely to occur even under the thermal impulse of a cooling/heating cycle, improving electrical connection reliability.

Moreover, according to the present embodiment, the cut-out portions 322 are provided entirely over the sections of the busbars 320 that overlap the resistor sections 332 of the shunt resistors 330, the terminals 322A of the cut-out portions 322 are set closer to the connection terminal sections 331 than to the resistor sections 332, and thus the busbars 320 are cut out to the vicinity of the connection terminal sections 331 of the shunt resistors 330, making it possible to prevent the solder from wetting and extending to the resistor sections 332 reliably.

Other Aspects

The technique described in the present description is not limited to the embodiment described with reference to the foregoing description and drawings, and the technical scope of the technique described in the present description may encompass, for example, the following aspects:

(1) In the foregoing embodiment, a circuit assembly 311 that does not include a heatsink is described, but a heatsink may be provided on the surfaces of the busbars 320 that are opposite to the circuit board side.

(2) The foregoing embodiment has described an example in which the cut-out portions 322 are provided entirely over the sections of the busbar 320 that overlap the resistor sections 332 of the shunt resistors 330, and the ends 322A of the cut-out portions 322 are set closer to the connection terminal sections 331 than to the resistor sections 332, but the present invention is not limited to this. The busbar may partially remain in the section that overlaps the resistor section of the shunt resistor.

(3) The foregoing embodiment has described an example in which two shunt resistors 330 are provided, but the present invention is not limited to this, and one or three of more shunt resistors 330 may be provided.

The invention claimed is:

1. A circuit assembly comprising:
   a circuit board that has an opening;
   a plurality of busbars are laid on one surface side of the circuit board;
   an electronic component has a main portion and a plurality of lead terminals, the lead terminals being connected to a pair of busbars of the plurality of busbars, the pair of busbars are exposed through the opening, each of the pair of busbars being spaced apart from each other so as to create a slot, the slot is also exposed through the opening, the electronic component disposed over the slot; and
   a heatsink is laid, via an adhesive agent, on surfaces of the plurality of busbars that are opposite to the circuit board, and
   wherein a portion of the pair of busbars that are exposed through the opening further and is disposed underneath the electronic component include cut-out portions, the cut-out portions are formed at opposing edges of portion of the plurality of busbars so as to create a gap wider than the slot, the gap for evacuating the adhesive agent.

2. The circuit assembly according to claim 1,
   wherein a pair of the cut-out portions are formed at positions of the plurality of busbars that are opposite to each other in the region of the opening.

3. An electrical junction box comprising:
the circuit assembly according to claim 1 further including a case in which the circuit assembly is disposed.

4. An electrical junction box comprising: the circuit assembly according to claim 3 further including a case in which the circuit assembly is disposed.

5. A circuit assembly comprising:
a circuit board that is made of an insulating plate on which an electrically conducting path is formed, and that is provided with a through-hole; and
a busbar substrate that is laid on the circuit board, and that includes a plurality of busbars made of plate-shaped metal, and cut sections formed by cutting a tie bar connecting the plurality of busbars,
wherein the cut sections of the busbar substrate are formed at positions that are contiguous with the through-hole of the circuit board.

6. The circuit assembly according to claim 5,
wherein the busbars in which the cut sections are formed include terminal sections that are connectable to the outside, and the terminal sections are bent in the vicinity of an edge of the circuit board.

7. The circuit assembly according to claim 6, further comprising:
an electronic component that has lead terminals that are connected to the busbars,
wherein the lead terminals are connected to the busbars in which the cut sections are formed via the through-hole.

8. The circuit assembly according to claim 5, further comprising:
an electronic component that has lead terminals that are connected to the busbars,
wherein the lead terminals are connected to the busbars in which the cut sections are formed via the through-hole.

9. An electrical junction box comprising: the circuit assembly according to claim 5 further including a case in which the circuit assembly is disposed.

10. A circuit assembly comprising:
a circuit board that has an opening;
a plurality of busbars that are laid on one surface side of the circuit board, the plurality of the busbars including a pair of busbars, the pair of busbars spaced apart from each other so as to form a slot disposed within the opening of the circuit board; and
a shunt resistor that has connection terminal sections that are connected to the pair of busbars in the opening of the circuit board by soldering, and a resistor section that is contiguous to the connection terminal sections and disposed over the slot,
wherein solder fillets that connect the shunt resistor and the busbars are formed closer to the connection terminal sections than to the resistor section.

11. The circuit assembly according to claim 10,
wherein cut-out portions are formed in areas of the busbars that overlap the resistor section of the shunt resistor, and ends of the cut-out portions are set to be closer to the connection terminal sections than to the resistor section.

12. An electrical junction box comprising: the circuit assembly according to claim 10 further including a case in which the circuit assembly is disposed.

13. A connected busbar structure comprising:
a tie bar that connects a plurality of busbars made of plate-shaped metal such that the busbars can be cut apart, the connected busbar structure serving as a busbar substrate by being laid on a circuit board made of an insulating plate on which an electrically conducting path is formed and cutting the tie bar,
wherein the tie bar is formed at a position that is contiguous with a through-hole formed in the circuit board.

* * * * *